US011276771B2

(12) United States Patent
Naito

(10) Patent No.: US 11,276,771 B2
(45) Date of Patent: Mar. 15, 2022

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/854,880

(22) Filed: Apr. 21, 2020

(65) Prior Publication Data

US 2020/0251581 A1 Aug. 6, 2020

Related U.S. Application Data

(63) Continuation of application No. PCT/JP2019/018041, filed on Apr. 26, 2019.

(30) Foreign Application Priority Data

May 17, 2018 (JP) .............................. JP2018-095259

(51) Int. Cl.
*H01L 29/739* (2006.01)
*H01L 27/06* (2006.01)
(Continued)

(52) U.S. Cl.
CPC ...... *H01L 29/7397* (2013.01); *H01L 27/0635* (2013.01); *H01L 29/0696* (2013.01);
(Continued)

(58) Field of Classification Search
CPC ............. H01L 27/0635; H01L 29/0696; H01L 29/7397; H01L 29/0804; H01L 29/0821;
(Continued)

(56) References Cited

U.S. PATENT DOCUMENTS

2007/0108468 A1 5/2007 Takahashi
2008/0048295 A1 2/2008 Takahashi
(Continued)

FOREIGN PATENT DOCUMENTS

JP 2007134625 A 5/2007
JP 2008053648 A 3/2008
(Continued)

OTHER PUBLICATIONS (ISA/237) Written Opinion of the International Search Authority for International Patent Application No. PCT/JP2019/018041, issued/mailed by the Japan Patent Office dated Jul. 16, 2019.
(Continued)

*Primary Examiner* — Igwe U Anya

(57) ABSTRACT

A semiconductor device is provided, which includes a semiconductor substrate, a transistor section and a diode section. Each of the transistor and diode sections includes a plurality of trench parts, an insulating portion formed on an inner wall of each trench part, a conductive portion provided in each trench part, a plurality of mesa parts, an interlayer dielectric film having contact holes, and a first electrode in contact with the mesa parts via the contact holes. The mesa parts in the transistor section include T-side mesa parts arranged closest to the diode section, the mesa parts in the diode section include D-side mesa parts arranged closest to the transistor section, and a maximum mesa width of mesa parts electrically connected to the first electrode in the transistor section is greater than both a mesa width of the T-side mesa parts and a mesa width of the D-side mesa parts.

19 Claims, 13 Drawing Sheets

(51) Int. Cl.
   *H01L 29/06* (2006.01)
   *H01L 29/08* (2006.01)
   *H01L 29/10* (2006.01)
   *H01L 29/417* (2006.01)
   *H01L 29/423* (2006.01)

(52) U.S. Cl.
   CPC ...... *H01L 29/0804* (2013.01); *H01L 29/0821* (2013.01); *H01L 29/1095* (2013.01); *H01L 29/41708* (2013.01); *H01L 29/4236* (2013.01)

(58) Field of Classification Search
   CPC ........... H01L 29/1095; H01L 29/41708; H01L 29/4236
   USPC ....................................................... 257/140
   See application file for complete search history.

(56) References Cited

U.S. PATENT DOCUMENTS

| | | | |
   |---|---|---|---|
   | 2014/0084335 A1 | 3/2014 | Senoo | |
   | 2015/0091051 A1 | 4/2015 | Laven | |
   | 2016/0035867 A1 | 2/2016 | Pfirsch | |
   | 2016/0043073 A1 | 2/2016 | Tamura | |
   | 2017/0025522 A1* | 1/2017 | Naito | H01L 29/407 |
   | 2017/0047322 A1* | 2/2017 | Yoshida | H01L 29/739 |
   | 2017/0077216 A1 | 3/2017 | Kouno | |
   | 2017/0162560 A1 | 6/2017 | Takahashi | |
   | 2019/0148365 A1 | 5/2019 | Kono | |

FOREIGN PATENT DOCUMENTS

| | | | |
   |---|---|---|---|
   | JP | 2009021557 | A | 1/2009 |
   | JP | 2015185742 | A | 10/2015 |
   | JP | 2016032105 | A | 3/2016 |
   | JP | 2018014418 | A | 1/2018 |
   | WO | 2012169053 | A1 | 12/2012 |
   | WO | 2015050262 | A1 | 4/2015 |
   | WO | 2016030966 | A1 | 3/2016 |
   | WO | 2016080269 | A1 | 4/2017 |

OTHER PUBLICATIONS

Office Action issued for counterpart Japanese Application No. 2020-519565, issued by the Japan Patent Office dated Jun. 22, 2021 (drafted on Jun. 17, 2021).

* cited by examiner ns are incorporated herein by reference:
SEMICONDUCTOR DEVICE The contents of the following Japanese patent applications are incorporated herein by reference:
NO. 2018-095259 filed in JP on May 17, 2018, and
NO. PCT/JP2019/018041 filed on Apr. 26, 2019.

BACKGROUND

1. Technical Field

The present invention relates to a semiconductor device.

2. Related Art

In the related art, a semiconductor device in which one semiconductor substrate is provided with a transistor device such as an insulated gate bipolar transistor (IGBT) and a diode device such as a free wheel diode is known (for example, refer to Patent Documents 1 and 2).

Patent Document 1: WO2012/169053
Patent Document 2: Japanese Patent Application Publication No. 2009-021557

GENERAL DISCLOSURE

For the semiconductor device having the diode device, it is preferably to improve a reverse recovery withstand.

A first aspect of the present invention provides a semiconductor device including a semiconductor substrate having a first conductivity-type drift region. The semiconductor device may comprise a transistor section having a second conductivity-type collector region exposed on a lower surface of the semiconductor substrate. The semiconductor device may comprise a diode section having a first conductivity-type cathode region exposed on the lower surface of the semiconductor substrate, and provided alongside of the transistor section in an arrangement direction, as seen from above. Each of the transistor section and the diode section may include a plurality of trench parts each ranging from an upper surface of the semiconductor substrate to the drift region and arranged in the arrangement direction. Each of the transistor section and the diode section may include an insulating portion formed on an inner wall of each of the trench parts. Each of the transistor section and the diode section may include a conductive portion provided in each of the trench parts and insulated from the inner wall of each of the trench parts by the insulating portion. Each of the transistor section and the diode section may include a plurality of mesa parts each arranged between adjacent two of the trench parts in the arrangement direction and each having a predetermined mesa width in the arrangement direction. Each of the transistor section and the diode section may include an interlayer dielectric film provided to cover a part of the trench parts on the upper surface of the semiconductor substrate and having contact holes for exposing upper surfaces of one or more of the mesa parts. Each of the transistor section and the diode section may include a first electrode in contact with the mesa parts via the contact holes. The mesa parts in the transistor section may include two or more T-side mesa parts arranged the closest to the diode section. The mesa parts in the diode section may include one or more D-side mesa parts arranged the closest to the transistor section. A maximum mesa width of mesa parts electrically connected to the first electrode in the transistor section may be greater than both a mesa width of each of the T-side mesa parts and a mesa width of each of the D-side mesa parts.

At least one of the T-side mesa parts and the D-side mesa parts arranged at a boundary between the transistor section and the diode section may have the mesa width which is the smallest in a plurality of mesa parts which are the mesa parts included in the transistor section and the diode section.

The mesa width of each of the T-side mesa parts and the D-side mesa parts may be smaller than the mesa width of a mesa part of the mesa parts that is arranged at a center of the transistor section in the arrangement direction.

The transistor section may include gate trench parts and dummy trench parts as the trench parts. The T-side mesa parts and the D-side mesa parts may be arranged between the dummy trench parts.

At least one trench part of the trench parts that are in contact with at least one of the T-side mesa parts and the D-side mesa parts may not be covered with the interlayer dielectric film, and the conductive portion thereof may be in contact with the first electrode.

The trench part arranged between the two of the T-side mesa parts, the trench part arranged between the two of the D-side mesa parts, and the trench part arranged between the T-side mesa parts and the D-side mesa parts may not be covered with the interlayer dielectric film, and the conductive portions thereof may be in contact with the first electrode.

The dummy trench parts arranged between the T-side mesa parts and the mesa parts each having a greater mesa width greater than those of the T-side mesa parts may be covered with the interlayer insulating film.

All the trench parts in the diode section may not be covered with the interlayer dielectric film, and the conductive portions thereof may be in contact with the first electrode.

All the mesa parts in the diode section may be the D-side mesa parts.

A mesa part of the mesa parts that is arranged at a center of the diode section in the arrangement direction may have the mesa width greater than that the width of the a D-side mesa part of the D-side mesa parts of the diode section arranged the closest to the transistor section in the diode section.

At least some of the mesa parts of the transistor section may each include a first conductivity-type emitter region arranged in contact with the gate trench parts and exposed to on the upper surface of the semiconductor substrate. At least some of the mesa parts of the transistor section may each include a second conductivity-type base region provided between the emitter region and the drift region. At least some of the mesa parts of the transistor section may each include a second conductivity-type contact region exposed on to the upper surface of the semiconductor substrate and having a higher doping concentration higher than that of the base region. At least some of the mesa parts of the transistor section may each include a plug region exposed on to the upper surface of the semiconductor substrate and having a higher doping concentration higher than that of the contact region. The D-side mesa parts in the diode section may not be provided with the plug region.

The transistor section may include a first mesa part having a first conductivity-type emitter region arranged in contact with the gate trench parts and exposed to on the upper surface of the semiconductor substrate. At least some of the T-side mesa parts of the transistor section may be carrier extraction mesa parts of which an area ratio of a second conductivity-type region exposed to on the upper surface of the semiconductor substrate to an area of each of the mesa parts is greater than the area ratio of the first mesa part.

The trench parts in contact with the carrier extraction mesa parts may not be covered with the interlayer dielectric film.

The diode section may include a lifetime control region on the upper surface-side of the semiconductor substrate. The lifetime control region may also be provided in at least some of the T-side mesa parts of the transistor section.

Each of the diode section and the transistor section may include a lifetime control region on the upper surface-side of the semiconductor substrate. A low-defect region having a smaller defect density smaller than that of the lifetime control region may be provided between the lifetime control region in the diode section and the lifetime control region in the transistor section in the arrangement direction.

The low-defect region may be provided within in a range including a boundary between the diode section and the transistor section.

At least some of the mesa parts in the transistor section may each include a first conductivity-type emitter region exposed to on the upper surface of the semiconductor substrate. At least some of the mesa parts in the transistor section may each include a second conductivity-type base region provided between the emitter region and the drift region. At least some of the mesa parts in the transistor section may each include an accumulation region provided between the base region and the drift region and having a higher doping concentration than the drift region. A value of integral of the doping concentrations of the accumulation regions of in the T-side mesa parts in along a depth direction may be greater than a value of integral of the doping concentrations of the accumulation regions in the other mesa parts in along the depth direction.

The summary of the present invention does not necessarily describe all necessary features of the present invention. The present invention may also be a sub-combination of the features described above.

DESCRIPTION OF EXEMPLARY EMBODIMENTS

Hereinbelow, embodiments of the present invention will be described. However, the embodiments do not limit the invention defined in the claims. Also, all combinations of features described in the embodiments are not necessarily essential to solving means of the invention.

As used herein, one side in a direction parallel to a depth direction of a semiconductor substrate is referred to as 'upper' and the other side is referred to as 'lower'. One surface of two principal surfaces of a substrate, a layer or other member is referred to as upper surface, and the other surface is referred to as lower surface. The 'upper' and 'lower' directions are not limited to a gravity direction or a mounting direction of a semiconductor device to a substrate and the like when mounting the same.

As used herein, the technical matters may be described using orthogonal coordinate axes of X-axis, Y-axis and Z-axis, in some cases. As used herein, a plane parallel to the upper surface of the semiconductor substrate is defined as XY plane, and a depth direction perpendicular to the upper surface of the semiconductor substrate is defined as Z-axis.

In each embodiment, an example in which a first conductivity-type is N type and a second conductivity-type is P type is described. However, the first conductivity-type may be P type and the second conductivity-type may be N type. In this case, the conductivity types of the substrate, layers, regions, and the like in each embodiment are reversed. Also, as used herein, P+ type (or N+ type) means that a doping concentration is higher than P type (or N type), and P− type (or N− type) means that a doping concentration is lower than P type (or N type).

As used herein, a doping concentration refers to a concentration of impurities transformed to donors or acceptors As used herein, there is a case in which a difference of concentration of the donors and acceptors is defined as the doping concentration. In this case, the doping concentration may be measured by an SR method. Also, chemical concentrations of donors and acceptors may be defined as the doping concentration. In this case, the doping concentration may be measured by an SIMS method. Unless otherwise limited, any of the above may be used as the doping concentration. Unless otherwise limited, a peak value of a doping concentration distribution in a doped region may be defined as the doping concentration in the doped region.

Figure 1:
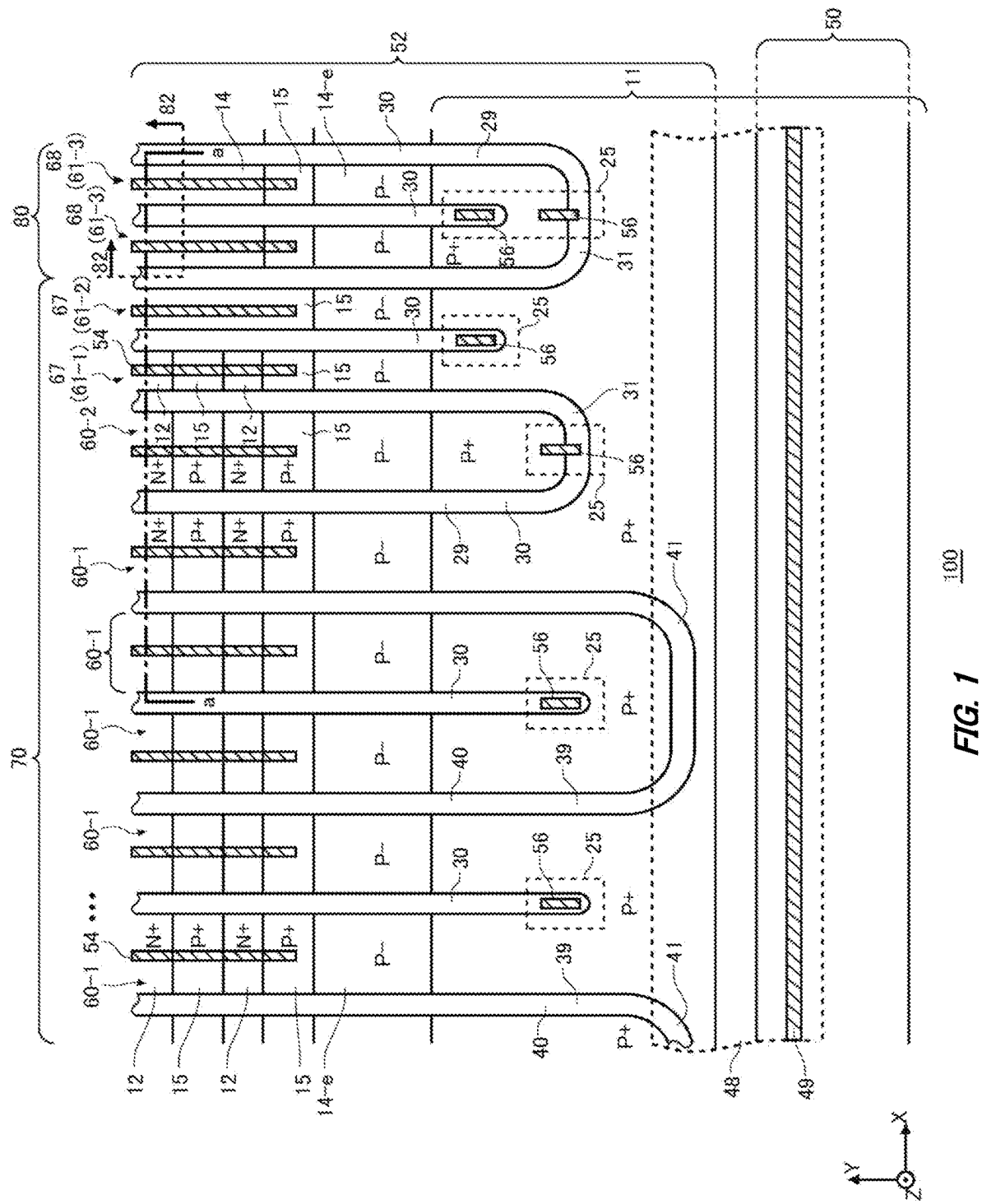
FIG. 1 partially shows an upper surface of a semiconductor device 100 in accordance with an embodiment of the present invention.

FIG. 1 partially shows an upper surface of a semiconductor device 100 in accordance with an embodiment of the present invention. The semiconductor device 100 of the present example is a semiconductor chip including a transistor section 70 including a transistor such as an insulated gate bipolar transistor and a diode section 80 including a diode such as a free wheel diode. The free wheel diode is arranged in parallel to the transistor. The free wheel diode is a reverse conducting diode that allows current to flow in an opposite direction to main current of the transistor. The diode section 80 is provided alongside of the transistor section 70 in a predetermined arrangement direction on an upper surface of a semiconductor substrate. As used herein, the arrangement direction is an X-axis direction. As an example, the transistor section 70 and the diode section 80 are alternately provided in the X-axis direction. FIG. 1 shows an upper surface of the chip in the vicinity of an end portion of the chip, and other regions are omitted.

The diode section 80 is a region in which a cathode region 82 is provided on a lower surface-side of the semiconductor substrate. The cathode region 82 is exposed on the lower surface-side of the semiconductor substrate, and is in contact with an electrode provided in the lower surface of the semiconductor substrate. Herein, a region overlapping the cathode region 82 in a Z-axis direction is set as the diode section 80. That is, when the cathode region 82 is projected to the upper surface of the semiconductor substrate in a direction perpendicular to the lower surface of the semiconductor substrate, a projection region is set as the diode section 80. Also, a region from an end of the projection region in the Y-axis direction to an end of an active region in the Y-axis direction is set as an extension region. The extension region may also be set as the diode section 80. The Y-axis direction is perpendicular to both the X-axis direction and the Z-axis direction. The diode section 80 may refer to a region, in which a second conductivity-type region is provided on the upper surface of the semiconductor substrate, of the projection region and the extension region.

The transistor section 70 may refer to a region of the active region, except the diode section 80. The transistor section 70 has a second conductivity-type collector region exposed on the lower surface of the semiconductor substrate. The transistor section 70 is a projection region when a collector region is projected to the upper surface of the semiconductor substrate, and may also refer to a region in which a predetermined unit configuration including an emitter region 12 and a contact region 15 (which will be described later) is regularly arranged.

In FIG. 1, an active region of the semiconductor substrate of the semiconductor device 100 is shown. The active region refers to a region in which, when the semiconductor device 100 is controlled to an on state, current flows between the upper surface and the lower surface of the semiconductor substrate. For example, the active region is a region surrounded by a gate metal layer 50 shown in FIG. 1.

The semiconductor device 100 may comprise an edge termination structure part surrounding the active section. For example, the edge termination structure part is provided on a further end portion-side of the semiconductor substrate than the gate metal layer 50 shown in FIG. 1. The edge termination structure part alleviates electric field concentration on the upper surface-side of the semiconductor substrate. The edge termination structure part may have, for example, a guard ring, a field plate, RESURF or a combined structure of the two or more thereof.

The semiconductor device 100 of the present example includes gate trench parts 40, dummy trench parts 30, a well region 11, emitter regions 12, base regions 14 and contact regions 15 provided inside of the upper surface-side of the semiconductor substrate. Also, the semiconductor device 100 of the present example includes an emitter electrode 52 and a gate metal layer 50 provided above the upper surface of the semiconductor substrate. The emitter electrode 52 and the gate metal layer 50 are provided separated from each other. Each of the gate trench part 40 and the dummy trench part 30 is an example of the trench part.

An interlayer dielectric film is provided between the emitter electrode 52 and gate metal layer 50 and the upper surface of the semiconductor substrate but is not shown in FIG. 1. In the interlayer insulating film of the present example, contact holes 56, a contact hole 49 and contact holes 54 are provided to penetrate the interlayer insulating film. In FIG. 1, each contact hole is obliquely hatched. In the meantime, the obliquely hatched portion of the contact hole 54 is a portion to which the upper surface of the semiconductor substrate is exposed, and a pn-junction surface between the emitter region 12 and the contact region 15 is also exposed. In FIG. 1 and the like, the hatched portion of the contact hole 54 and the solid line indicative of the pn-junction surface are shown overlapped.

The emitter electrode 52 is provided above the gate trench parts 40, the dummy trench parts 30, the well region 11, the emitter regions 12, the base regions 14 and the contact regions 15. The emitter electrode 52 is in contact with the emitter regions 12, the contact regions 15 and the base regions 14 on the upper surface of the semiconductor substrate 10 via the contact holes 54. The emitter electrode 52 is connected to a dummy conductive portion in the dummy trench part 30 via the contact hole 56. A connection portion 25 formed of a conductive material such as polysilicon doped with impurities may be provided between the emitter electrode 52 and the dummy conductive portion. The connection portion 25 is provided on the upper surface of the semiconductor substrate. An insulating film such as a thermally oxidized film is provided between the connection portion 25 and the semiconductor substrate.

The gate metal layer 50 applies a gate voltage to the transistor section 70. The gate metal layer 50 may be connected to a gate pad provided above the upper surface of the semiconductor substrate. The gate pad is connected to an external device by a wire or the like. The gate metal layer 50 may be provided to surround the active region, as seen from above. As an example, the gate metal layer 50 is provided in a ring shape along an outer periphery of the semiconductor substrate, as seen from above.

The gate metal layer 50 is in contact with a gate wiring 48 via the contact hole 49. The gate wiring 48 is formed of polysilicon doped with impurities, and the like. An insulating film such as a thermally oxidized film is provided between the gate wiring 48 and the semiconductor substrate. The gate wiring 48 is connected to a gate conductive portion in the gate trench part 40 on the upper surface of the semiconductor substrate. The gate wiring 48 is not connected to the dummy conductive portion in the dummy trench part 30.

The gate wiring 48 of the present example is provided from below the contact hole 49 to an edge portion 41 of the gate trench part 40. The edge portion 41 is an end portion of the gate trench part 40 that is the closest to the gate metal layer 50. At the edge portion 41 of the gate trench part 40, the gate conductive portion is exposed on the upper surface of the semiconductor substrate and is in contact with the gate wiring 48.

The emitter electrode 52 and the gate metal layer 50 are formed of a material including metal. For example, at least a part of a region of each of the emitter electrode 52 and the gate metal layer 50 is formed of aluminum or an aluminum-silicon alloy. Each of the emitter electrode 52 and the gate metal layer 50 may have a barrier metal formed of, for example, titanium or a titanium compound in a lower layer of the region formed of aluminum or the like. Also, each of the emitter electrode 52 and the gate metal layer 50 may have a plug that is formed by embedding tungsten or the like so as to be in contact with the barrier metal and aluminum or the like, in the contact hole.

The well region 11 is provided overlapping the gate metal layer 50 and the gate wiring 48. The well region 11 is also provided to extend by a predetermined width in a region that does not overlap the gate metal layer 50 and the gate wiring 48. The well region 11 of the present example is provided apart from an end portion of the contact hole 54 in the Y-axis direction toward the gate metal layer 50. An end of the well region 11 in the Y-axis direction may be located closer to the contact hole 54 than the edge portion 41 of the gate trench part 40 and an edge portion 31 of the dummy trench part 30. The well region 11 is a second conductivity-type region having a higher doping concentration than the base region 14. In the present example, the base region 14 is of P− type, and the well region 11 is of P+ type.

The transistor section 70 has a plurality of trench parts arranged in the arrangement direction. In the transistor section 70 of the present example, one or more gate trench parts 40 and one or more dummy trench parts 30 are alternately provided in the arrangement direction. The arrangement of the gate trench parts 40 and the dummy trench parts 30 is not limited thereto. A unit of one gate trench part 40 and two or more dummy trench parts 30 may be repeatedly arranged in the arrangement direction. Alternatively, a unit of one dummy trench part 30 and two or more gate trench parts 40 may be repeatedly arranged in the arrangement direction. A unit of two or more gate trench parts 40 and two or more dummy trench parts 30 may be repeatedly arranged in the arrangement direction.

The diode section 80 has a plurality of trench parts arranged in the arrangement direction. The diode section 80 of the present example is provided with a plurality of dummy trench parts 30 in the arrangement direction. The diode section 80 of the present example is not provided with the gate trench part 40. The diode section 80 may be provided with the gate trench part 40. Also, a surface of the diode section 80 may be provided with a region having the same conductivity type and depth as the emitter region so as to be in contact with the gate trench part 40 or the dummy trench part 30.

The gate trench part 40 of the present example may have two extension portions 39 (portions of the trench that are linear along an extension direction) extending in an extension direction perpendicular to the alignment direction and an edge portion 41 connecting the two extension portions 41. The extension direction in FIG. 1 is the Y-axis direction.

At least a part of the edge portion 41 is preferably formed in a curved shape, as seen from above. The end portions, which are the ends of the linear portions along the extension direction, of the two extension portions 39 of the gate trench part 40 are connected by the edge portion 41, so that electric field concentration at the end portions of the extensions portions 39 can be reduced. The gate wiring 48 may be connected to a gate conductive portion at the edge portion 41 of the gate trench part 40.

In the transistor section 70, the dummy trench part 30 is provided between the respective extension portions 39 of the gate trench part 40. One dummy trench part 30 may be provided or a plurality of dummy trench parts 30 may be provided between the respective extension portions 39. The dummy trench part 30 may have a linear shape extending in the extension direction, and may have extension portions 29 and an edge portion 31, like the gate trench part 40. The semiconductor device 100 shown in FIG. 1 includes both the linear dummy trench part 30 with no edge portion 31 and the dummy trench part 30 having the edge portion 31.

A diffusion depth of the well region 11 may be greater than depths of the gate trench part 40 and the dummy trench part 30. That is, the well region 11 may have both a bottom of the edge portion 41 of the gate trench part 40 in a depth direction (−Z-axis direction) and a bottom of the edge portion 31 of the dummy trench part 30 in the depth direction. The end portions of the gate trench part 40 and the dummy trench part 30 in the Y-axis direction are provided in the well region 11, as seen from above. That is, the bottom of each trench part in the depth direction at the end portion of each trench part in the Y-axis direction is covered with the well region 11. As used herein, the depth direction may also be referred to as the Z-axis direction. The bottom is covered with the well region 11, so that the electric field concentration on the bottom of each trench part can be reduced.

A mesa part 60 or a mesa part 61 is provided between every adjacent pair of two trench parts in the arrangement direction. Each of these mesa parts has a predetermined mesa width in the arrangement direction. The mesa part refers to a region sandwiched between the trench parts in the semiconductor substrate. As an example, the upper end of the mesa part is the upper surface of the semiconductor substrate. A depth position of the lower end of the mesa part is the same as the depth position of the lower end of the trench part.

The mesa width of the mesa part 61 is smaller than the mesa width of the mesa part 60. As used herein, the mesa part 61 is referred to as narrow-width mesa part 61. The narrow-width mesa part 61 includes a T-side mesa part 67 located in the transistor section 70 and a D-side mesa part 68 located in the diode section 80. In FIG. 1 and other figures, the narrow-width mesa part 61 that is the T-side mesa part 67 is denoted with a combined reference sign in which the reference sign for one is written in parentheses, such as 67 (61-1). Also, the narrow-width mesa part 61 that is the D-side mesa part 68 is denoted with a combined reference sign in which a reference sign for one is written in parentheses. A trench part that is in contact with both the T-side mesa part 67 and the D-side mesa part 68 includes a position at which a boundary between the cathode region 82 and the collector region 22 is projected on the upper surface. A width of the T-side mesa part 67 and a width of the D-side mesa part 68 in the arrangement direction (X-axis direction) may be the same as or different from each other.

In the transistor section 70, a maximum mesa width of mesa parts electrically connected to the emitter electrode 52 via the contact holes 54 is greater than both the mesa width of any T-side mesa part 67 and the mesa width of any D-side mesa part 68. The mesa parts 60 except the narrow-width mesa parts 61 include a mesa part of which the mesa width is the greatest. The narrow-width mesa part 61 may be a mesa part having a mesa width smaller than the maximum mesa width. The narrow-width mesa part 61 may refer to a mesa part having a mesa width smaller than an average mesa width of mesa parts provided in the semiconductor substrate or may refer to a mesa part having the smallest mesa width.

The width of the T-side mesa part 67 may be smaller than a width of a mesa part that is the smallest in the transistor section 70 except the T-side mesa part 67. The width of the D-side mesa part 68 may be smaller than a width of a mesa part that is the smallest in the diode section 80 except the D-side mesa part 68.

The mesa parts 61 and 60 each sandwiched between the trench parts are provided with the base regions 14. A region of the base region 14 exposed on the upper surface of the semiconductor substrate and arranged the closest to the gate metal layer 50 in each mesa part is referred to as a base region 14-e. In FIG. 1, the base region 14-e arranged at one end portion of each mesa part is shown. However, the base region 14-e is also arranged at the other end portion of each mesa part. In some mesa parts, at least one of the first conductivity-type emitter region 12 and the second conductivity-type contact region 15 may be provided in a region sandwiched between the base regions 14-e, as seen from above. In the present example, the emitter region 12 is of N+ type and the contact region 15 is of P+ type. The emitter region 12 and the contact region 15 may also be provided between the base region 14 and the upper surface of the semiconductor substrate in the depth direction.

A mesa part 60 of the mesa parts 60 that has the emitter region 12 exposed on the upper surface of the semiconductor substrate and is provided in contact with the gate trench part 40 is referred to as first mesa part 60-1. The emitter region 12 is exposed on the upper surface of the semiconductor substrate and is provided in contact with the gate trench part 40. In the present example, the first mesa part 60-1 is provided with the contact region 15 exposed on the upper surface of the semiconductor substrate.

Each of the contact region 15 and the emitter region 12 extends from one trench part to the other trench part in the X-axis direction. As an example, the contact region 15 and the emitter region 12 of the first mesa part 60-1 are alternately provided in the extension direction (Y-axis direction) of the trench part.

In another example, the contact region 15 and the emitter region 12 of the first mesa part 60-1 may be provided in stripes in the extension direction (Y-axis direction) of the trench part. For example, the emitter region 12 is provided in a region in contact with the trench part, and the contact region 15 is provided in a region sandwiched between the emitter regions 12.

A mesa part 60 of the mesa parts 60 that is not in contact with the gate trench part 40 is referred to as second mesa part 60-2. An upper surface of the second mesa part 60-2 may be provided with the emitter region 12. In the present example, the emitter region 12 and the contact region 15 are alternately provided in the Y-axis direction on the upper surface of the second mesa part 60-2. The second mesa part 60-2 may also be arranged in a mesa part other than the T-side mesa part 67 in the transistor section 70.

A narrow-width mesa part 61 of the narrow-width mesa parts 61 in which the emitter region 12 is provided is referred to as first narrow-width mesa part 61-1. In the present example, the first narrow-width mesa part 61-1 is arranged between the dummy trench parts 30. The emitter region 12 and the contact region 15 may be alternately provided in the Y-axis direction on an upper surface of the first narrow-width mesa part 61-1. The positions on the Y-axis at which the emitter region 12 and the contact region 15 are provided may be the same among the first mesa part 60-1, the second mesa part 60-2 and the first narrow-width mesa part 61-1. The first narrow-width mesa part 61-1 may be the T-side mesa part 67 or the D-side mesa part 68. In the present example, the first narrow-width mesa part 61-1 is the T-side mesa part 67.

A narrow-width mesa part 61 of the narrow-width mesa parts 61 of which a ratio of an area having the contact region 15 provided therein to an area of a mesa part is relatively large is referred to as second narrow-width mesa part 61-2. The area of the mesa part refers to an area as seen from above. The area ratio of the contact region 15 refers to a value obtained by dividing an area of the contact region 15 by an area of the mesa part, as seen from above. An area ratio of the contact region 15 in the second narrow-width mesa part 61-2 may be greater than an area ratio of the contact region 15 in the first mesa part 60-1, greater than an area ratio of the contact region 15 in the second mesa part 60-2, greater than an area ratio of the contact region 15 in the first narrow-width mesa part 61-1, and greater than an area ratio of the contact region 15 in a third narrow-width mesa part 61-3 that will be described later. The second narrow-width mesa part 61-2 may be the T-side mesa part 67 or the D-side mesa part 68. In the present example, the second narrow-width mesa part 61-2 is the T-side mesa part 67.

In the present example, the second narrow-width mesa part 61-2 is provided with the contact region 15 over the entire region sandwiched between the base regions 14-e, as seen from above. The second narrow-width mesa part 61-2 functions as a carrier extraction mesa part that extracts carriers such as holes toward the emitter electrode 52 upon turn-off of the transistor section 70, for example.

A narrow-width mesa part 61 of the narrow-width mesa parts 61 of which an area ratio of the emitter region 12 is smaller than the first mesa part 60-1 is referred to as third narrow-width mesa part 61-3. The third narrow-width mesa part 61-3 may not be provided with the emitter region 12. In the third narrow-width mesa part 61-3 of the present example, the contact region 15 is arranged in contact with the base region 14-e, as seen from above. Also, in the third narrow-width mesa part 61-3 of the present example, the base region 14 is arranged over the entire region sandwiched between the contact regions 15, as seen from above. The third narrow-width mesa part 61-3 may be the T-side mesa part 67 or the D-side mesa part 68. In the present example, the third narrow-width mesa part 61-3 is the D-side mesa part 68.

The narrow-width mesa part 61 is arranged at a boundary between the transistor section 70 and the diode section 80 in the arrangement direction. In the present example, two or more mesa parts arranged successively and collectively the closest to the diode section 80 in the transistor section 70 are the narrow-width mesa parts 61, and, in the present example, are the T-side mesa parts 67. As an example, in the transistor section 70, one or more second narrow-width mesa parts 61-2 and one or more first narrow-width mesa parts 61-1 are sequentially arranged successively in the arrangement direction in this order from the diode section 80-side. In the example of FIG. 1, the number of the second narrow-width mesa parts 61-2 and the number of the first narrow-width mesa parts 61-1 are each one. However, the number of each narrow-width mesa part 61 is not limited thereto. In the meantime, the transistor section 70 may have the second mesa part 60-2, instead of the T-side mesa part 67 that is the first narrow-width mesa part 61-1.

One or more second mesa parts 60-2 and a plurality of first mesa part 60-1 are arranged on a inner side of the first narrow-width mesa part 61-1 that is the T-side mesa part 67 in the transistor section 70. The second mesa part 60-2 is arranged on the inner side of the first narrow-width mesa part 61-1, and the first mesa part 60-1 is arranged on the inner side of the second mesa part 60-2. The inner side in the transistor section 70 refers to a position close to a center of the transistor section 70 in the arrangement direction (X-axis direction). In the example of FIG. 1, the number of the second mesa part 60-2 is one. However, the number of the second mesa part 60-2 is not limited thereto.

Also, in the diode section 80, one or more mesa parts arranged the closest to the transistor section 70 are the narrow-width mesa parts 61, and, in the present example, are the D-side mesa parts 68. As an example, the diode section 80 has the third narrow-width mesa part 61-3, which is the closest to the transistor section 70 in the diode section 80. A plurality of third narrow-width mesa parts 61-3 may be successively arranged in the arrangement direction.

Each of the mesa parts 60 is provided with the contact hole 54. The contact hole 54 is arranged in a region sandwiched between the base regions 14-e. In the present example, the contact hole 54 is provided above each of the contact region 15 and the emitter region 12. The contact hole 54 is not arranged in regions corresponding to the base region 14-e and the well region 11.

The narrow-width mesa part 61 (i.e., the T-side mesa part 67 and the D-side mesa part 68) may or may not be provided with the contact hole 54. In the example of FIG. 1, the contact hole 54 is provided. Also in the narrow-width mesa part 61, the contact hole 54 is arranged in a region sandwiched between the base regions 14-e.

The narrow-width mesa part 61 is provided at the boundary between the transistor section 70 and the diode section 80, so that it is possible to reduce the flow of holes from the boundary part toward the cathode region 82 upon, for example, reverse recovery of the diode section 80. For this reason, it is possible to improve a reverse recovery withstand of the semiconductor device 100. Also, two or more narrow-width mesa parts 61 are provided in the transistor section 70, so that it is possible to increase a distance between the mesa part 60 in which an injection amount of holes is relatively large and the cathode region 82. For this reason, it is possible to improve the reverse recovery withstand.

Also, the mesa part serving as the carrier extraction mesa part is configured as the second narrow-width mesa part 61-2, so that it is possible to further reduce the flow of the holes toward the cathode region 82. The hole extraction efficiency is not lowered so much even when the mesa width is reduced.

Figure 2:
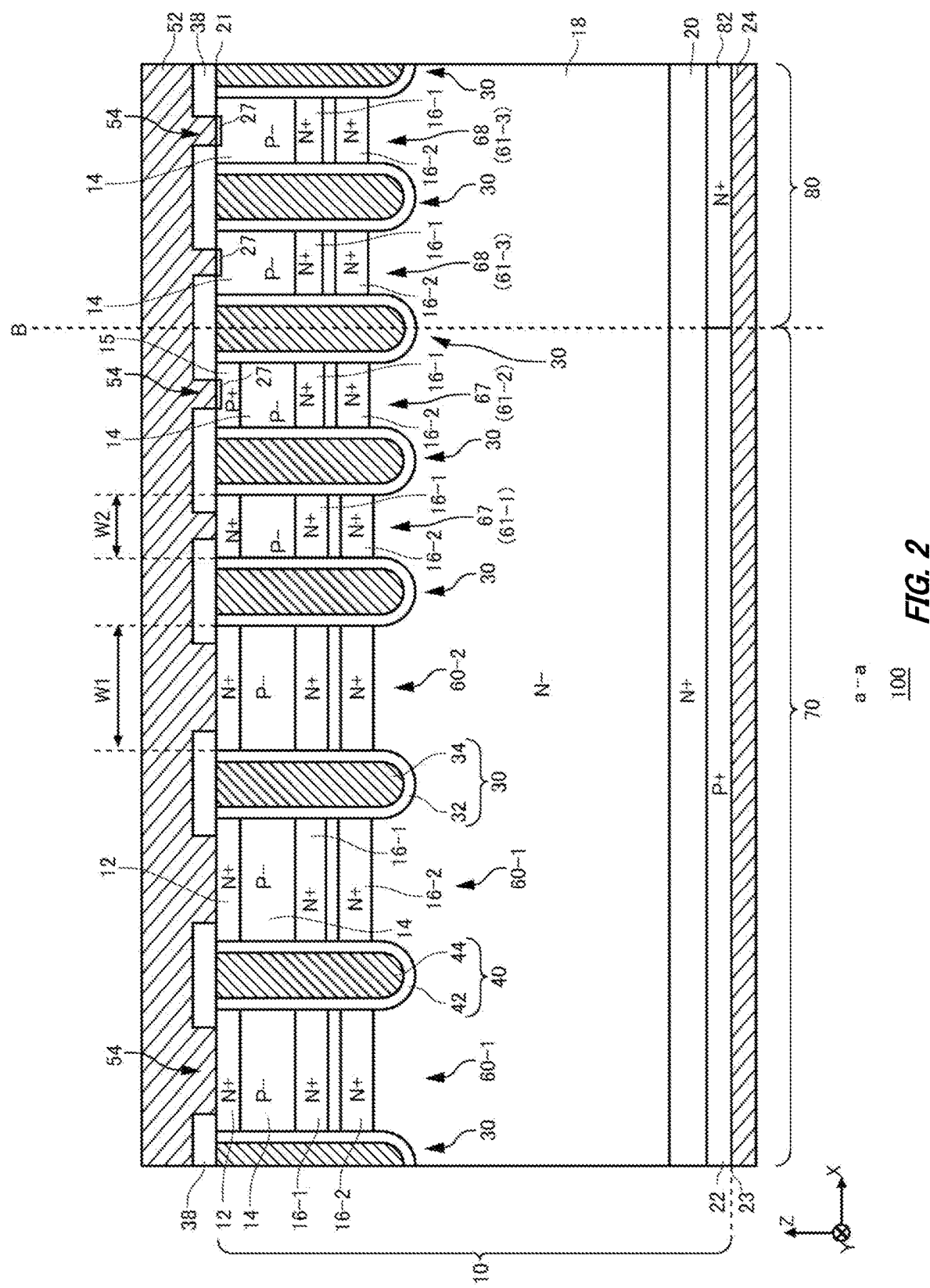
FIG. 2 shows an example of a cross-sectional view taken along a line a-a in FIG. 1.

FIG. 2 shows an example of a cross-sectional view taken along a line a-a in FIG. 1. The cross-section a-a lies on an XZ plane passing the emitter region 12. In the cross-section, the semiconductor device 100 of the present example includes a semiconductor substrate 10, an interlayer dielectric film 38, an emitter electrode 52 and a collector electrode 24. The interlayer dielectric film 38 is provided on an upper surface 21 of the semiconductor substrate 10. The interlayer dielectric film 38 is a dielectric film such as silicate glass added with impurities of, for example, boron, phosphorus or the like. The interlayer dielectric film 38 may be in contact with the upper surface 21 of the semiconductor substrate 10, and another film such as an oxide film may be provided between the interlayer dielectric film 38 and the semiconductor substrate 10. The interlayer dielectric film 38 is provided with the contact holes 54, 49 and 56 described in FIG. 1. In FIG. 2, the contact holes 54 are shown.

The emitter electrode 52 is provided on the interlayer dielectric film 38. The emitter electrode 52 is in contact with the upper surface 21 of the semiconductor substrate 10 through the contact holes 54 in the interlayer dielectric film 38. The emitter electrode 52 is an example of the first electrode. The collector electrode 24 is provided on a lower surface 23 of the semiconductor substrate 10. The emitter electrode 52 and the collector electrode 24 are formed of a conductive material such as metal. As used herein, a direction in which the emitter electrode 52 and the collector electrode 24 are interconnected is referred to as depth direction.

The semiconductor substrate 10 may be a silicon substrate, a silicon carbide substrate, a nitride semiconductor substrate of, for example, gallium nitride, or the like. In the present example, the semiconductor substrate 10 is a silicon substrate. The semiconductor substrate 10 has an N− type drift region 18. The drift region 18 is provided in both the transistor section 70 and the diode section 80.

The mesa part 60 and the first narrow-width mesa part 61-1 are provided with the N+ type emitter region 12 and the P− type base region 14 in this order from the upper surface 21-side of the semiconductor substrate 10. The emitter region 12 is exposed on the upper surface 21 of the semiconductor substrate 10. The base region 14 is provided between the emitter region 12 and the drift region 18.

The mesa part 60 and the first narrow-width mesa part 61-1 may be each provided with an N+ type accumulation region 16. The accumulation region 16 is provided between the base region 14 and the drift region 18. The accumulation region 16 is a region in which N type dopants are accumulated in a higher concentration than the drift region. In the present example, dopants of the accumulation region 16 and the drift region 18 are phosphorus. One or more accumulation regions 16 may be provided in the depth direction. In the example of FIG. 2, two accumulation regions 16-1 and 16-2 are provided in each mesa part. Each accumulation region 16 may have a peak of the doping concentration in the depth direction. The accumulation region 16 having a higher concentration than the drift region 18 is provided between the drift region 18 and the base region 14, so that it is possible to increase a carrier injection enhancement effect (IE effect), thereby reducing the on-voltage.

The second narrow-width mesa part 61-2 is provided with the P+ type contact region 15 and the base region 14 in this order from the upper surface 21 of the semiconductor substrate 10. The contact region 15 is exposed on the upper surface 21 of the semiconductor substrate 10. The base region 14 is provided between the contact region 15 and the drift region 18. In the second narrow-width mesa part 61-2, one or more accumulation regions 16 may be provided between the base region 14 and the drift region 18.

The third narrow-width mesa part 61-3 is provided with the base region 14 exposed on the upper surface 21 of the semiconductor substrate 10. In the third narrow-width mesa part 61-3, one or more accumulation regions 16 may be provided between the base region 14 and the drift region 18. In the present example, the accumulation region 16 may be provided to cover the entire lower surface of the base region 14 in each mesa part.

In both the transistor section 70 and the diode section 80, an N+ type buffer region 20 is provided below the drift region 18. A doping concentration in the buffer region 20 is higher than a doping concentration in the drift region 18. The buffer region 20 may serve as a field stop layer to prevent a depletion layer, which expands from the lower surface of the base region 14, from reaching the P+ type collector region 22 and the N+ type cathode region 82. The buffer region 20 may have a plurality of peaks or a single peak of a doping concentration distribution in the depth direction.

In the transistor section 70, the P+ type collector region 22 is provided below the buffer region 20. In the diode section 80, the N+ type cathode region 82 is provided below the buffer region 20. The collector region 22 and the cathode region 82 are exposed on the lower surface 23 of the semiconductor substrate 10.

On the upper surface 21-side of the semiconductor substrate 10, one or more gate trench parts 40 and one or more dummy trench parts 30 are provided. Each trench part ranges from the upper surface 21 of the semiconductor substrate 10 to the drift region 18 through the base region 14. In a region in which at least any of the emitter region 12, the contact region 15 and the accumulation region 16 is provided, each trench part reaches the drift region 18 through the regions. The configuration of "the trench part penetrating a doped region" is not limited to the one made through a manufacturing sequence of forming the doped region and then forming the trench part. A manufacturing of forming trench parts and then forming the doped region between the trench parts is also included in the configuration of "the trench part penetrating the doped region".

The gate trench part 40 has a gate trench, a gate insulating film 42 and a gate conductive portion 44 provided on the upper surface 21 of the semiconductor substrate 10. The gate insulating film 42 is provided covering an inner wall of the gate trench. The gate insulating film 42 may be formed by oxidizing or nitriding a semiconductor of the inner wall of the gate trench. The gate conductive portion 44 is provided further inside the gate trench than the gate insulating film 42. That is, the gate insulating film 42 provides insulation between the gate conductive portion 44 and the semiconductor substrate 10 of the inner wall of the gate trench part. The gate conductive portion 44 is formed of a conductive material such as polysilicon.

The gate conductive portion 44 may extend deeper than the base region 14 in the depth direction. In the cross-section, the gate trench part 40 is covered by the interlayer dielectric film 38 on the upper surface 21 of the semiconductor substrate 10. When a predetermined voltage is applied to the gate conductive portion 44, an inversion layer of electrons serving as a channel is formed on a surface layer of the interface of the base region 14 with the gate trench.

In the cross-section, the dummy trench part 30 may have the same structure as the gate trench part 40. The dummy trench part 30 has a dummy trench, a dummy insulating film 32 and a dummy conductive portion 34 provided on the upper surface 21 of the semiconductor substrate 10. The dummy insulating film 32 is provided covering an inner wall of the dummy trench. The dummy conductive portion 34 is provided on a more inner side than the dummy insulating film 32 in the dummy trench. The dummy insulating film 32 insulates the dummy conductive portion 34 and the semiconductor substrate 10 of the inner wall of the dummy trench. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

In the present example, the dummy trench part 30 is covered by the interlayer dielectric film 38 on the upper surface 21 of the semiconductor substrate 10. In the meantime, bottoms of the dummy trench part 30 and the gate trench part 40 may each have a downwardly convex curved shape (a curve shape in a cross-section).

As described above with reference to FIG. 1, a mesa width W2 of the narrow-width mesa part 61 is smaller than a mesa width W1 of the mesa part 60. The mesa width W1 may be a maximum mesa width in the transistor section 70 or may be a mesa with of a mesa part 60 arranged at a center of the transistor section 70 in the arrangement direction. The narrow-width mesa part 61 having the smaller mesa width W2 than the mesa width W1 is provided at a boundary B between the transistor section 70 and the diode section 80. Thereby, upon reverse recovery, for example, it is possible to reduce an amount of holes flowing from the mesa part at the boundary B between the transistor section 70 and the diode section 80 toward the cathode region 82. For this reason, it is possible to improve the reverse recovery withstand.

The mesa width W2 may be 75% or less or a half or less of the mesa width W1. The mesa width W2 of the narrow-width mesa part 61 may be the same or different among the narrow-width mesa parts 61. For example, the mesa widths of the narrow-width mesa parts 61 in the transistor section 70 may be smaller closer to the boundary B between the transistor section 70 and the diode section 80. At least one of the T-side mesa part 67 and the D-side mesa part 68 arranged at the boundary between the transistor section 70 and the diode section 80 may have the mesa width which is the smallest in a plurality of mesa parts which are the mesa parts included in the transistor section 70 and the diode section 80.

The narrow-width mesa part 61 may be arranged between the dummy trench parts 30. That is, the narrow-width mesa part 61 is not in contact with the gate trench part 40. Thereby, it is possible to maintain the mesa width of the mesa part 60 functioning as a channel.

The boundary B between the transistor section 70 and the diode section 80 is a plane connecting a boundary between the collector region 22 and the cathode region 82 and a position in which the boundary is projected to the upper surface 21. The trench part in contact with both the T-side mesa part 67 and the D-side mesa part 68 includes the boundary B.

A width of the narrow-width mesa part 61 arranged in contact with the trench part (in the present example, the dummy trench part 30) including the boundary B may be the smallest in a plurality of mesa parts included in the transistor section 70 and the diode section 80. Thereby, the holes that are injected immediately above an end portion of the cathode region 82 are reduced to control the concentration of the holes on the end portion of the cathode region 82.

A position of the boundary B between the transistor section 70 and the diode section 80 in the arrangement direction is a positon of the boundary between the collector region 22 and the cathode region 82. In a case in which a trench part is provided on the upper surface 21 of the semiconductor substrate 10 in the boundary position, the narrow-width mesa part 61 arranged at the boundary is the narrow-width mesa part 61 (in the present example, the narrow-width mesa part 61-2 and the narrow-width mesa part 61-3) in contact with the trench part.

In another example, the second narrow-width mesa part 61-2 functioning as a carrier extraction mesa part may have a smaller mesa width than the other narrow-width mesa parts 61. That is, the mesa width of the second narrow-width mesa part 61-2 may be the smallest in the semiconductor device 100. Since the second narrow-width mesa part 61-2 has a large area ratio of the contact region 15, it is possible to effectively reduce the injection of the holes from the upper surface 21 of the semiconductor substrate 10 by reducing the mesa width of the second narrow-width mesa part 61-2.

Each mesa part may be provided with a second conductivity-type plug region 27 provided on the upper surface 21 exposed by the contact hole 54 and having a greater doping concentration than the contact region 15. The plug region 27 may not be provided in the emitter region 12. The plug region 27 is provided to reduce a contact resistance between the mesa part and the emitter electrode 52.

Figure 3:
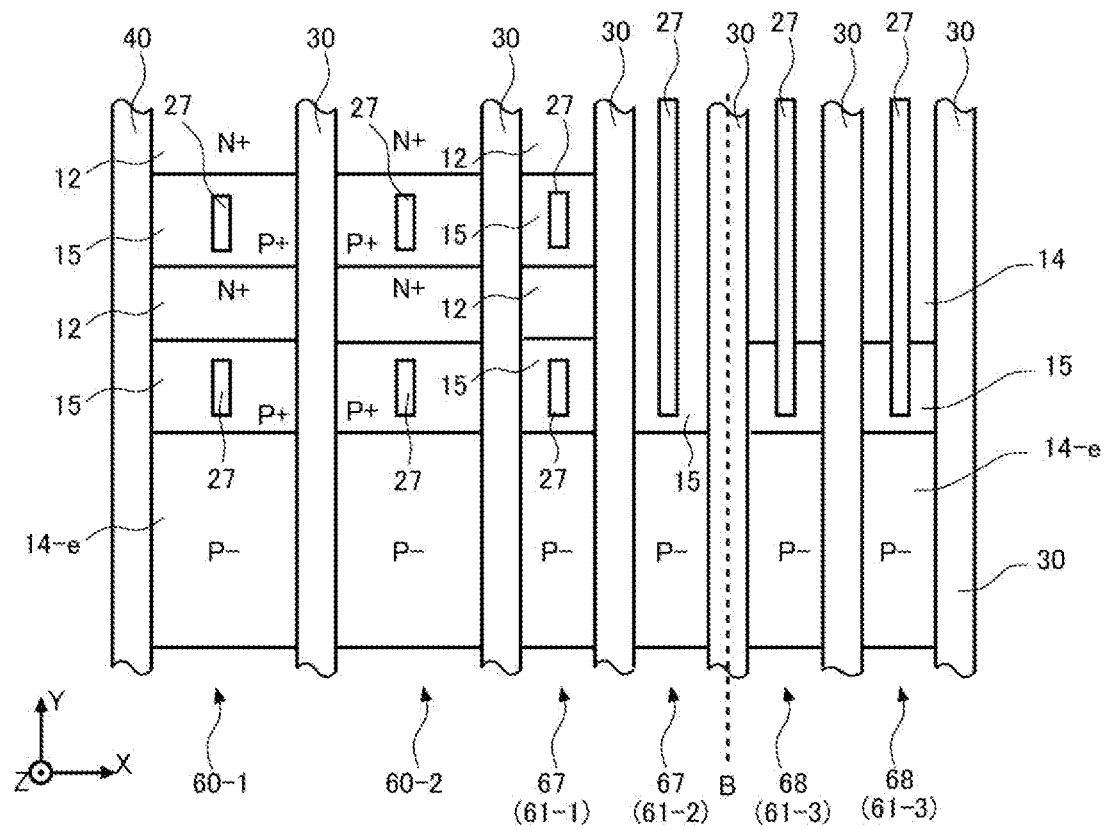
FIG. 3 shows an arrangement example of plug regions 27, as seen from above.

FIG. 3 shows an arrangement example of the plug regions 27, as seen from above. In the present example, the plug region 27 is provided in a P type region, in each mesa part. The P type region is, for example, the contact region 15 and the base region 14. However, the plug region 27 is not provided in the base region 14-e. The plug region 27 is provided to reduce a contact resistance between the P type region and the emitter electrode 52. In the meantime, the plug region 27 may also be provided in the emitter region 12.

Figure 4:
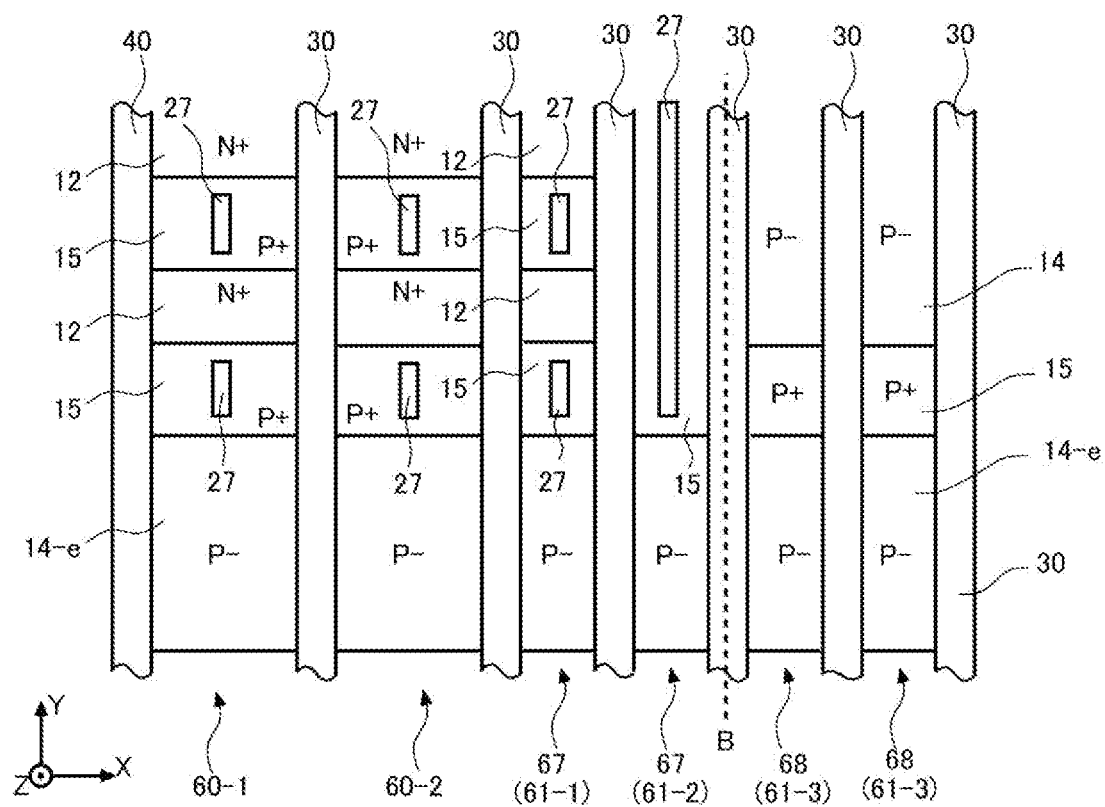
FIG. 4 shows another arrangement example of the plug regions 27, as seen from above.

FIG. 4 shows another arrangement example of the plug regions 27, as seen from above. In the present example, at least one narrow-width mesa part 61 is not provided with the plug region 27. Thereby, it is possible to reduce the injection of the holes from the narrow-width mesa part 61. In the example of FIG. 4, in the diode section 80, one or more third narrow-width mesa parts 61-3 arranged the closest to the transistor section 70 are not provided with the plug region 27. The second narrow-width mesa part 61-2 may be provided with the plug region 27. Thereby, while maintaining the hole extraction function of the second narrow-width mesa part 61-2, it is possible to reduce the injection of the holes from one or more third narrow-width mesa parts 61-3. All the third narrow-width mesa parts 61-3 may not be provided with the plug region 27.

In another example, the second narrow-width mesa part 61-2 may not also be provided with the plug region 27. Also, the first narrow-width mesa part 61-1 may not also be provided with the plug region 27. Thereby, it is possible to further reduce the hole injection.

Also, in another example, the second narrow-width mesa part 61-2 may have the base region 14, instead of the contact region 15 of the present example. The second narrow-width mesa part 61-2 may have or may not have the plug region 27 in the base region 14. Also, the second narrow-width mesa part 61-2 may have a second conductivity-type region of which a doping concentration is lower than the base region 14, instead of the contact region 15. Even with this configuration, it is possible to reduce the injection of the holes from the second narrow-width mesa part 61-2.

Figure 5:
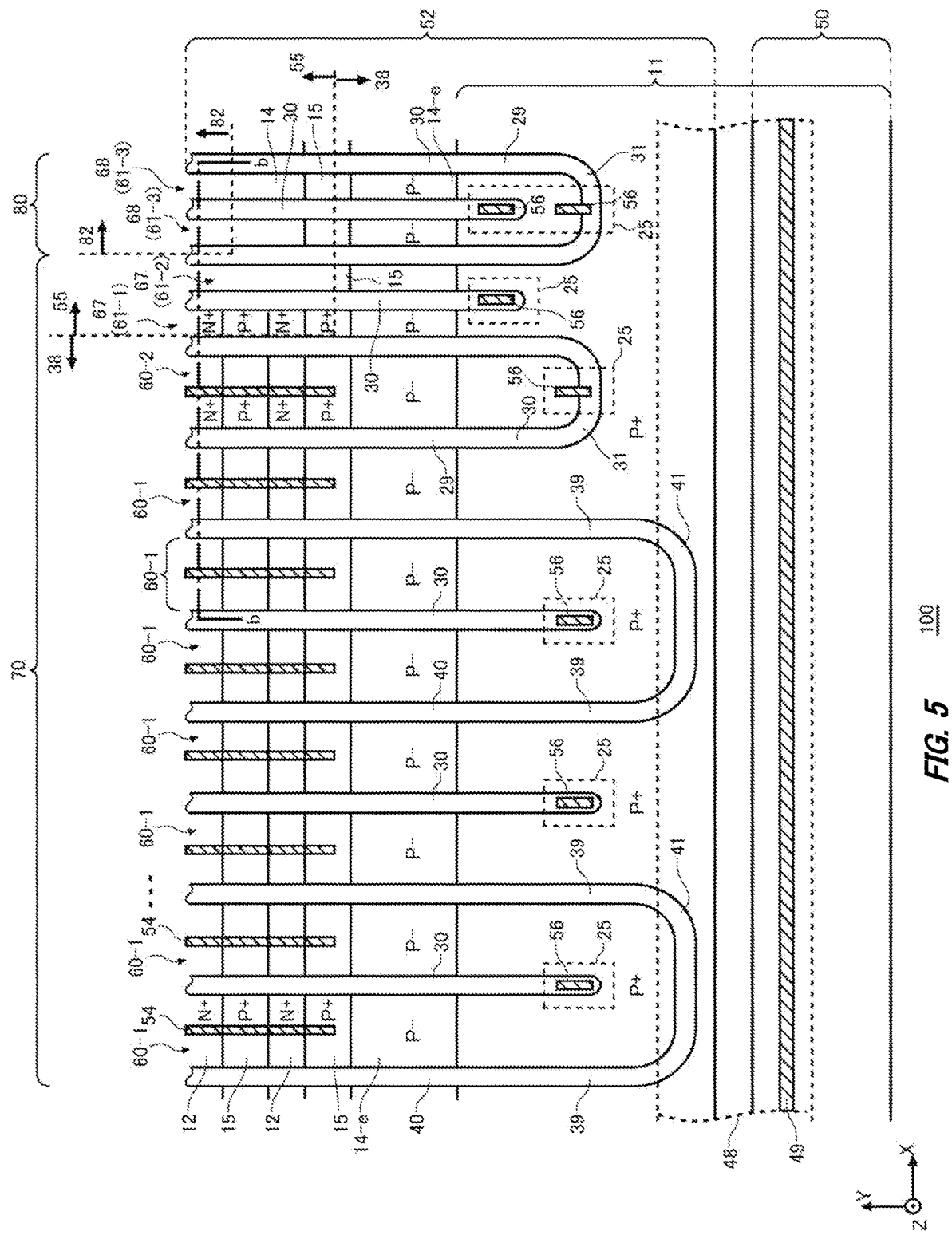
FIG. 5 shows another example of the upper surface of the semiconductor device 100.

FIG. 5 shows another example of the upper surface of the semiconductor device 100. The semiconductor device 100 of the present example is different from FIGS. 1 to 4, in terms of the arrangement of the contact holes in the interlayer dielectric film 38. The other structures may be the same as the semiconductor device 100 described with reference to FIGS. 1 to 4. In FIG. 5, a range in which the interlayer dielectric film 38 is provided is shown with the broken line. In the present example, the interlayer dielectric film 38 is provided covering a part of the trench parts on the upper surface 21 of the semiconductor substrate 10.

The interlayer dielectric film 38 of the present example has a contact hole 55, instead of the contact holes 54 provided in the narrow-width mesa parts 61. The contact hole 55 is provided over a plurality of narrow-width mesa parts 61 and a plurality of trench parts in the arrangement direction (X-axis direction). The contact hole 55 may have a width that is the same as or greater than the diode section 80 in the arrangement direction. Also, the contact hole 55 may be provided in a range greater than the cathode region 82, in both the X-axis direction and the Y-axis direction. The emitter electrode 52 is in contact with the upper surface 21 of the semiconductor substrate 10 through the contact hole 55.

In the present example, a position of an end portion of the contact hole 55 in the Y-axis direction is the same as a position of an end portion of the contact hole 54 in the Y-axis direction. That is, an end portion of the contact hole 55 in the Y-axis direction is arranged in the contact region 15 the closest to the base region 14-e in the Y-axis direction. That is, the contact hole 55 does not expose the edge portion 31 of the dummy trench part 30 in contact with the narrow-width mesa part 61. In another example, the contact hole 55 may expose at least one dummy trench part 30 in contact with the narrow-width mesa part 61, as a whole, as seen from above.

Figure 6:
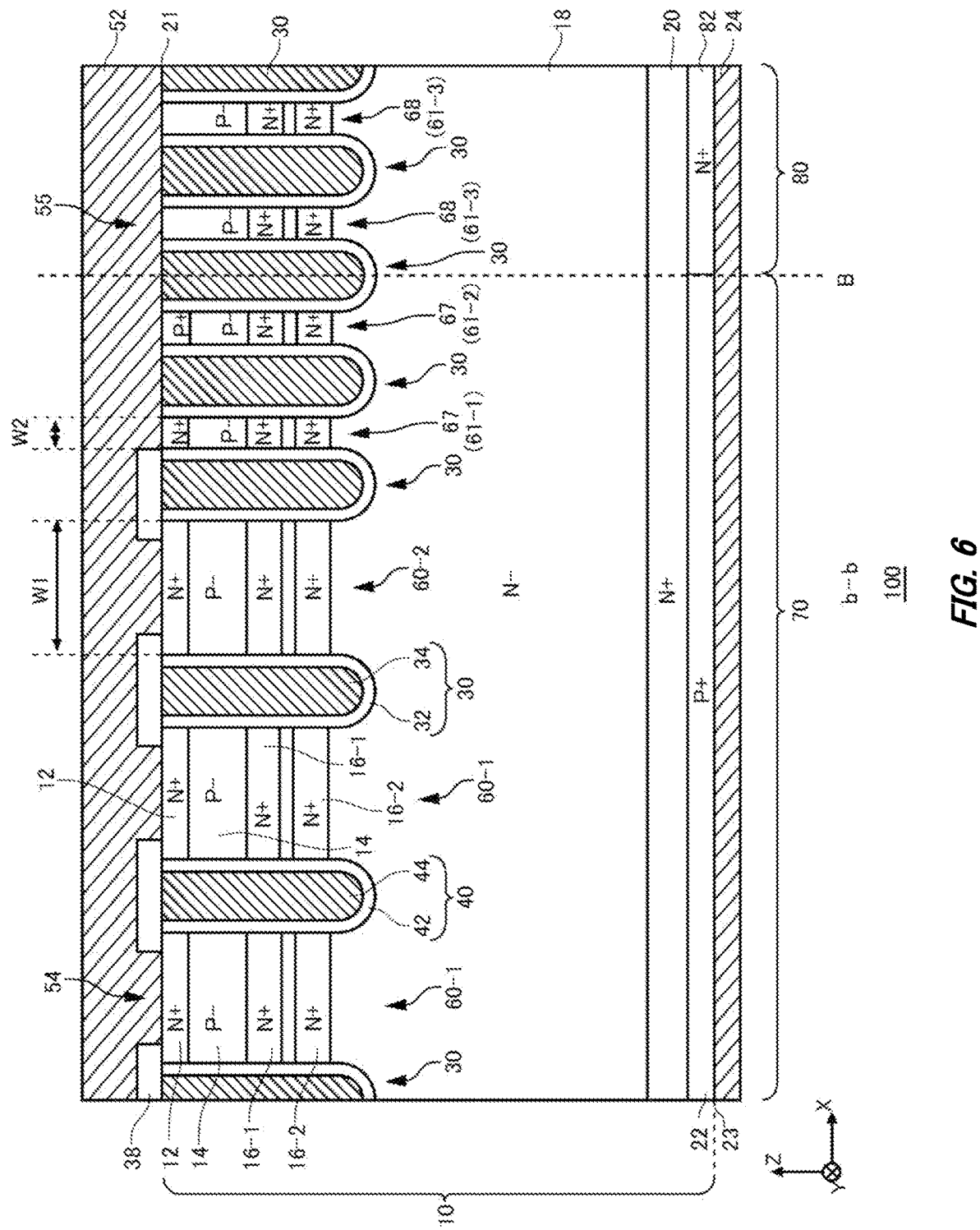
FIG. 6 shows an example of a cross-sectional view taken along a line b-b in FIG. 5.

FIG. 6 shows an example of a cross-sectional view taken along a line b-b in FIG. 5. The cross-section b-b is an XZ plane passing the emitter region 12 and the cathode region 82. In the present example, at least one dummy trench part 30 in contact with the narrow-width mesa part 61 is not covered with the interlayer dielectric film 38. That is, at least one dummy trench part 30 of the dummy trench parts 30 in contact with at least one of the T-side mesa part 67 and the D-side mesa part 68 is not covered with the interlayer dielectric film 38. In a region that is not covered with the interlayer dielectric film 38, the dummy conductive portion 34 of the dummy trench part 30 may be in contact with the emitter electrode 52.

The configuration "the dummy trench part 30 is not covered with the interlayer dielectric film 38" may refer to that there is a cross-section b-b in which the gate trench part 40 is covered with the interlayer dielectric film 38 and the dummy trench part 30 is not covered with the interlayer dielectric film 38. That is, as shown in FIG. 5, the dummy trench part 30 may be partially covered with the interlayer dielectric film 38, as seen from above. The dummy trench part 30 may be exposed over a half or more or ¾ or more in the Y-axis direction by the contact hole 55.

In the dummy trench part 30 that is not covered with the interlayer dielectric film 38, an upper surface of the dummy conductive portion 34 is exposed at the same level as or lower than the upper surface 21 of the semiconductor substrate 10 is. The exposed upper surface of the dummy conductive portion 34 is in contact with the emitter electrode 52 at the same level as or lower than the upper surface 21 is.

In the present example, at least the dummy trench part 30 arranged between the narrow-width mesa parts 61 is not covered with the interlayer dielectric film 38. The narrow-width mesa part 61 is also not covered with the interlayer dielectric film 38. That is, the dummy trench part 30 arranged between the two T-side mesa parts 67, the dummy trench part 30 arranged between the two D-side mesa parts 68, and the dummy trench part 30 arranged between the T-side mesa part 67 and the D-side mesa part 68 are not all covered with the interlayer dielectric film 38. In a region that is not covered with the interlayer dielectric film 38, the dummy conductive portion 34 of the dummy trench part 30 is in contact with the emitter electrode 52. By the above structure, even when the mesa width of the narrow-width mesa part 61 is finely made, it is possible to prevent the narrow-width mesa part 61 from being covered with the interlayer dielectric film 38, and to cause the narrow-width mesa part 61 to be in contact with the emitter electrode 52.

In the present example, the dummy trench part 30 that is in contact with the second narrow-width mesa part 61-2 functioning as the carrier extraction mesa part is not covered with the interlayer dielectric film 38. Thereby, even though there is variation in the position where the interlayer dielectric film 38 is provided, it is possible to prevent the second narrow-width mesa part 61-2 from being covered with the interlayer dielectric film 38. For this reason, it is possible to maintain the function as the carrier extraction mesa part.

The dummy trench part 30 arranged between the narrow-width mesa part 61 and the mesa part 60 each having a greater mesa width greater than those of the narrow-width mesa part 61 may be covered with the interlayer insulating film 38. In the present example, the dummy trench part 30 arranged between the second mesa part 60-2 and the first narrow-width mesa part 61-1 is covered with the interlayer dielectric film 38. In the meantime, the second mesa part 60-2 and the first narrow-width mesa part 61-1 are not at least partially covered with the interlayer dielectric film 38.

Figure 7:
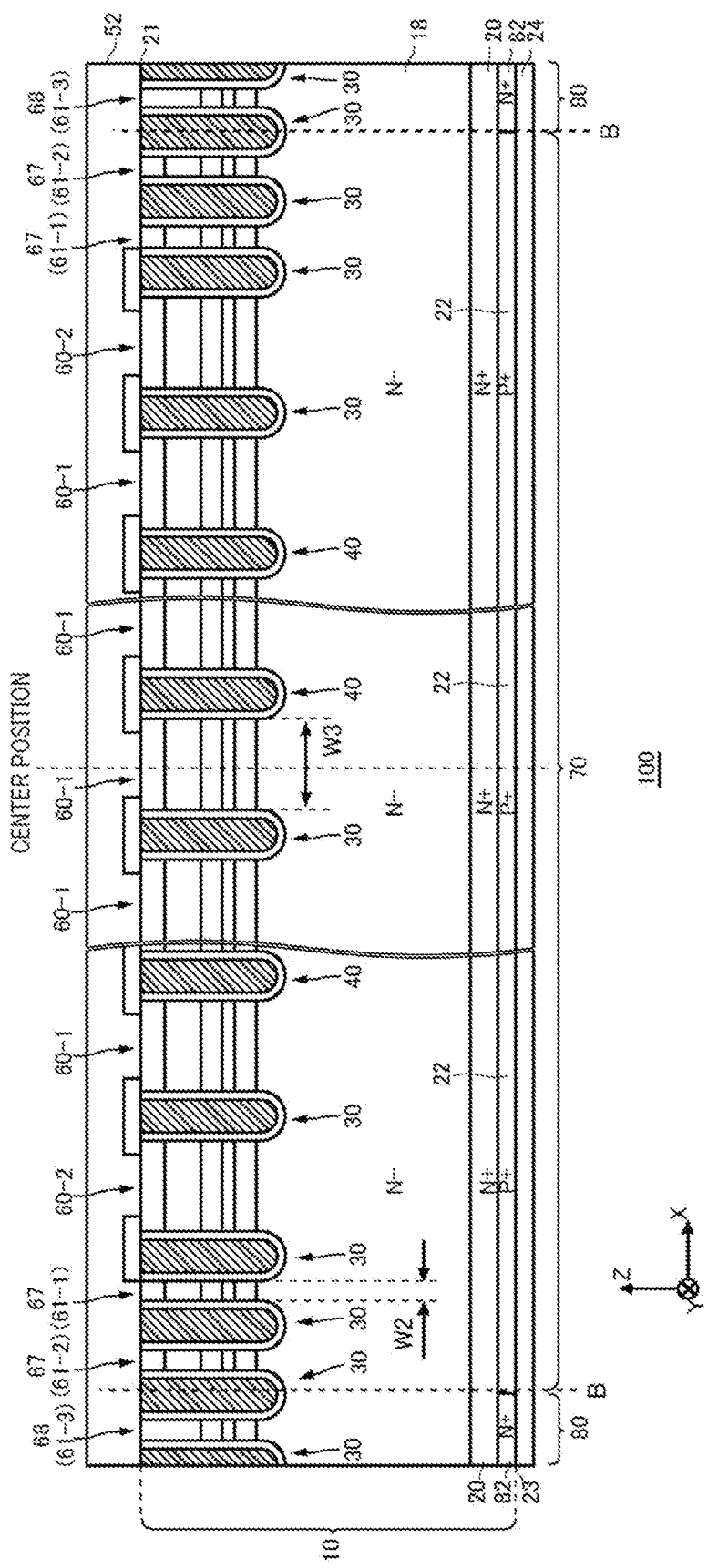
FIG. 7 shows an example of an XZ cross-section of a transistor section 70.

FIG. 7 shows an example of an XZ cross-section of the transistor section 70. The cross-section is a cross-section passing the emitter region 12 shown in FIG. 5. Since the structure of each mesa part shown in FIG. 7 is similar to each mesa part shown in FIGS. 1 to 6, the reference signs of the respective constitutional elements of each mesa part are omitted. Also, the hatching of the emitter electrode 52 and the collector electrode 24 is omitted.

In the present example, the transistor section 70 is provided between the two diode sections 80 in the arrangement direction (X-axis direction). The transistor section 70 has two or more narrow-width mesa parts 61 at each of both ends in the arrangement direction. The transistor section 70 has a plurality of first mesa parts 60-1 on a more inner side than the second mesa parts 60-2 arranged at both end portions in the arrangement direction.

A mesa width of a first mesa part 60-1 arranged in a center position of the transistor section 70 in the arrangement direction is denoted as W3. In the meantime, in a case in which a trench part is arranged in the center position, an average mesa width of two first mesa parts 60-1 in contact with the trench part is set as W3. The mesa width W2 of the narrow-width mesa part 61 may be smaller than the mesa width W3. The mesa width W2 may be a half or less of the mesa width W3.

Also, the mesa width W2 of the narrow-width mesa part 61 may be smaller than an average mesa width of the first mesa parts 60-1 in contact with the gate trench part 40. The mesa width W2 may be a half or less of the average mesa width.

In the meantime, the mesa width W3 may be the same as the mesa width W1 in the transistor section 70, other than the center position. Also, the mesa width W3 may be greater than the mesa width W1 or may be smaller than the mesa width W1. In the present example, the mesa width W3 is the same as the mesa width W1.

Figure 8:
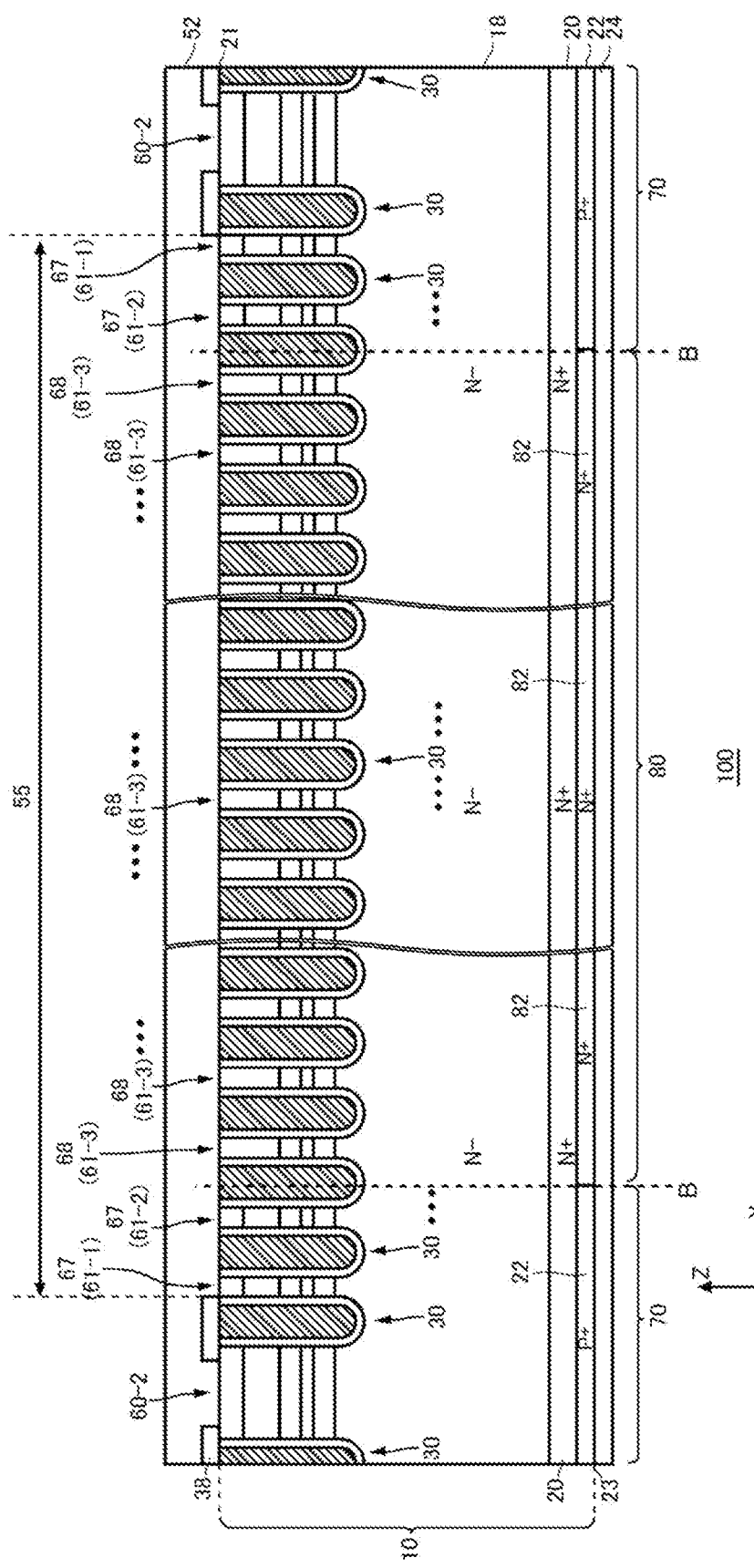
FIG. 8 shows an example of an XZ cross-section of a diode section 80.

FIG. 8 shows an example of an XZ cross-section of the diode section 80. The cross-section is a cross-section passing the emitter region 12 shown in FIG. 5. Since the structure of each mesa part shown in FIG. 8 is similar to each mesa part shown in FIGS. 1 to 6, the reference signs of the respective constitutional elements of each mesa part are omitted. Also, the hatching of the emitter electrode 52 and the collector electrode 24 is omitted.

In the present example, the diode section 80 is provided between the two transistor sections 70 in the arrangement direction (X-axis direction). The diode section 80 has one or more narrow-width mesa parts 61 at both ends in the arrangement direction. In the present example, all the mesa parts in the diode section 80 are the third narrow-width mesa parts 61-3 (i.e., the D-side mesa parts 68). Also, all the trench parts in the diode section 80 are not covered with the interlayer dielectric film 38, in the cross-section. That is, the contact hole 55 is provided successively from one end portion to the other end portion of the diode section 80 in the arrangement direction. The contact hole 55 of the present example may be provided successively to the first narrow-width mesa part 60-1 in the transistor section 70. By the above structure, it is possible to easily miniaturize the diode section 80. In a region that is not covered with the interlayer dielectric film 38, the conductive portion of the trench part is in contact with the emitter electrode 52.

Figure 9:
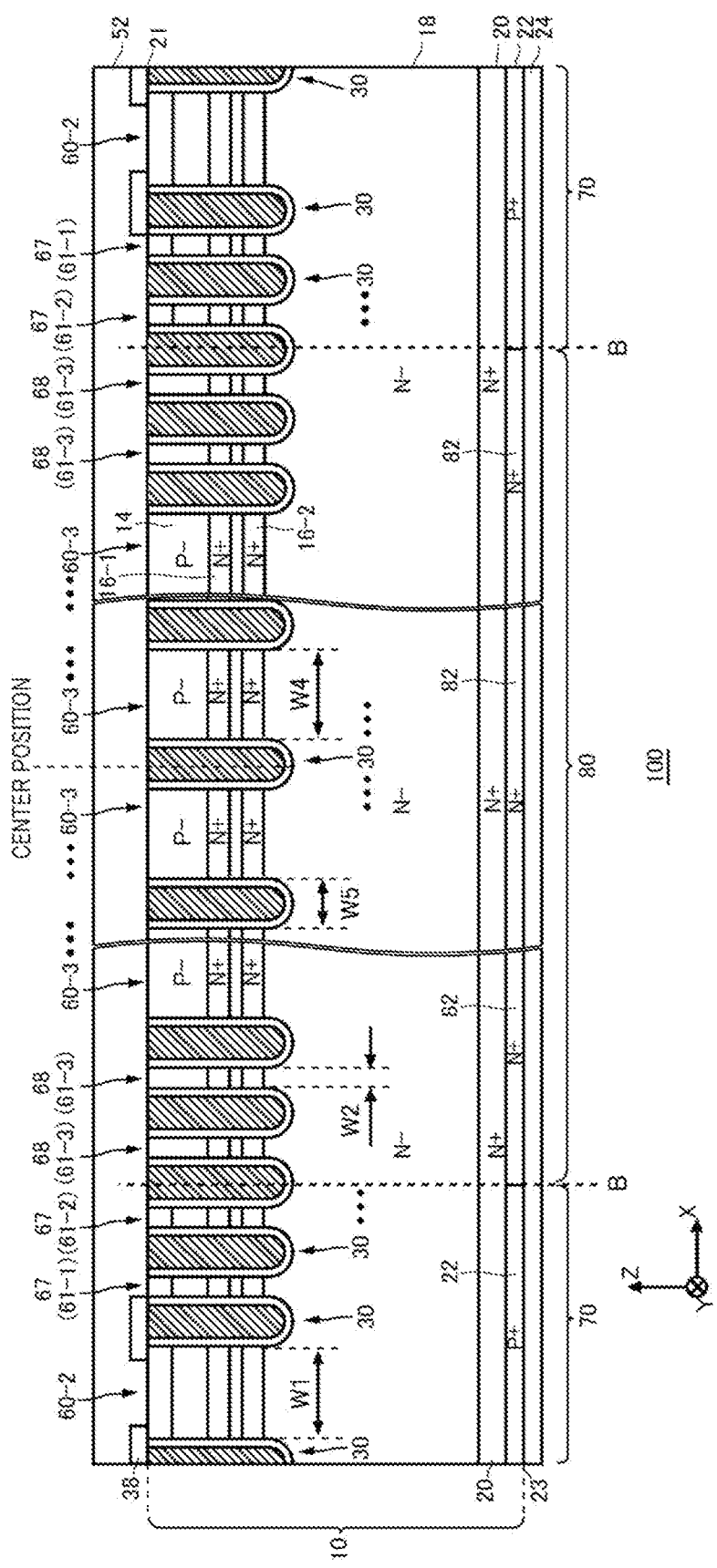
FIG. 9 shows another example of the XZ cross-section of the diode section 80.

FIG. 9 shows another example of the XZ cross-section of the diode section 80. The cross-section is a cross-section passing the emitter region 12 shown in FIG. 5. In the present example, the diode section 80 has third mesa parts 60-3. The third mesa part 60-3 has a greater mesa width than the narrow-width mesa part 61. The third mesa part 60-3 may have a mesa width that is the same as, greater than or smaller than the first mesa part 60-1 or the second mesa part 60-2. The dummy trench part 30 sandwiched between the third mesa parts 60-3 may be covered with the interlayer dielectric film 38 or not, in the cross-section. The third mesa part 60-3 may be sandwiched between the dummy trench parts 30.

The third mesa part 60-3 is provided in the base region 14 exposed on the upper surface 21 of the semiconductor substrate 10. The third narrow-width mesa part 61-3 may be provided with one or more accumulation regions 16 between the base region 14 and the drift region 18.

The diode section 80 may have the third mesa parts 60-3 in a predetermined range including a center position in the arrangement direction. That is, a mesa part arranged at the center of the diode section 80 in the arrangement direction has a greater mesa width than that a mesa part of the diode section arranged the closest to the transistor section 70 in the diode section 80. In the present example, the diode section 80 has the third narrow-width mesa parts 61-3 at a boundary with the transistor section 70, and the third mesa parts 60-3 at the center in the arrangement direction. Thereby, while reducing the injection of the holes in the vicinity of the boundary B with the transistor section 70, it is possible to increase an occupying area of the mesa parts in the diode section 80.

The mesa width W2 of the third narrow-width mesa part 61-3 is smaller than a mesa width W4 of the third mesa part 60-3. The mesa width W2 of the third narrow-width mesa part 61-3 may be smaller than a trench width W5 of the dummy trench part 30 in the arrangement direction. The mesa width W2 may be a half or less of the trench width W5.

Figure 10A:
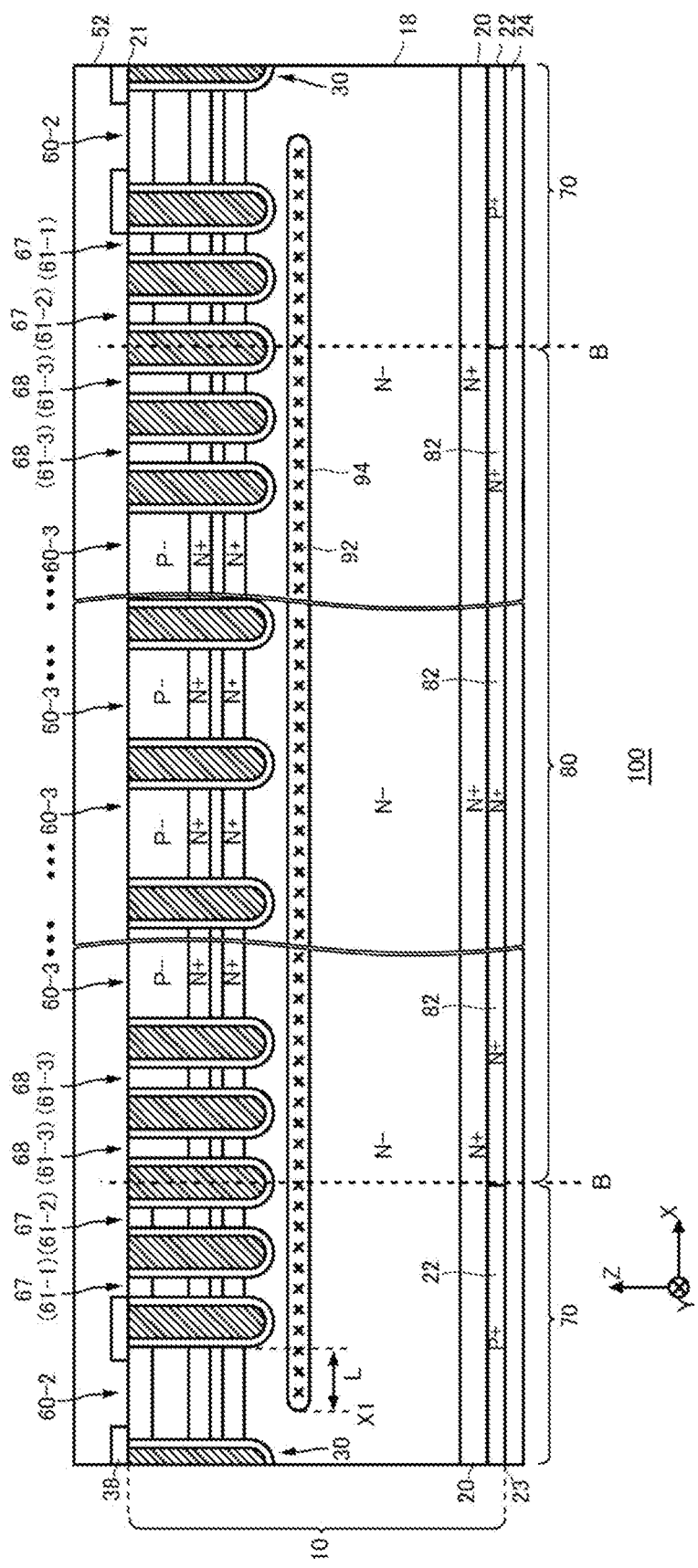
FIG. 10A shows another example of a cross-section of the diode section 80 and a part of the transistor sections 70 arranged on both sides of the diode section 80.

FIG. 10A shows another example of a cross-section of the diode section 80 and a part of the transistor sections 70 arranged on both sides of the diode section 80. The cross-section is an XZ cross-section passing the emitter region 12 and the cathode region 82.

The diode section 80 of the present example includes a lifetime control region 94 on the upper surface 21-side of the semiconductor substrate. The lifetime control region 94 may be provided in the entire diode section 80 in the arrangement direction or may be provided in a part thereof. In the present example, the lifetime control region 94 is provided in the entire diode section 80. In the meantime, the upper surface 21-side of the semiconductor substrate 10 refers to a region on a further upper surface 21-side than a center of the semiconductor substrate 10 in the depth direction.

The lifetime control region 94 is a region of which a density per a unit volume of crystal defects 92 is higher than other regions. The crystal defect 92 may be a defect serving as a recombination center of carriers and may be mainly composed of vacancy (V) or divacancy (VV). The density of the crystal defects 92 may be a density of the recombination center. A position in the depth direction where a density of the crystal defects 92 is greatest may be set as a position in the depth direction of the lifetime control region 94. In general, dopants such as donors and acceptors are also the crystal defects. However, as used herein, the crystal defect 92 is a defect mainly functioning as a recombination center for carrier recombination. The crystal defect 92 may be formed by injecting ions such as helium from the upper surface 21 or the lower surface 23 of the semiconductor substrate 10, for example.

In the present example, the lifetime control region 94 is also provided for at least some of the narrow-width mesa parts 61 in the transistor section 70. In the meantime, the configuration "the mesa part is provided with the lifetime control region 94" refers to that the lifetime control region 94 is provided below the mesa part.

The lifetime control region 94 may be provided for all of the narrow-width mesa parts 61 in the transistor section 70. The lifetime control region 94 may be provided for some of the mesa parts 60 in the transistor section 70. In the present example, the lifetime control region 94 is provided for some of the mesa parts 60 in the transistor section 70.

In the example of FIG. 10A, the lifetime control region 94 is formed in the entire diode section 80. The lifetime control region 94 in the diode section 80 extends to the narrow-width mesa parts 61 (D-side mesa parts 68) in the diode section 80. In the meantime, the lifetime control region 94 extends from the D-side mesa parts 68 to the narrow-width mesa parts 61 (T-side mesa parts 67) in the transistor section 70. The lifetime control region 94 extending to the T-side mesa parts 67 extends to the second mesa parts 60-2 beyond inner-side ends of the T-side mesa parts 67. The inner-side end of the T-side mesa part 67 refers to an end on a center-side of the transistor section 70 of both ends of the T-side mesa part 67 in the X-axis direction. Also, the lifetime control region 94 may extend to the first mesa part 60-1. That is, the lifetime control region 94 in the diode section 80 may extend to the narrow-width mesa part 61, and further extend to the mesa part in the transistor section 70 beyond the narrow-width mesa part 61.

An end portion position X1 of the lifetime control region 94 in the arrangement direction is arranged below the second mesa part 60-2. However, the end portion position X1 may be arranged below the first mesa part 60-1 or may be arranged below any one dummy trench part 30 in the transistor section 70.

A distance L from an end portion in the X-axis direction of a trench part sandwiched between the narrow-width mesa part 61 and the mesa part 60 to an end portion in the X-axis direction of the lifetime control region 94 may be equal to or greater than 50 μm and equal to or less than 100 μm. The distance L may be twice or greater or five times or greater as large as the mesa width of the mesa part 60. The distance L may be less than a thickness of the semiconductor substrate 10.

Figure 10B:
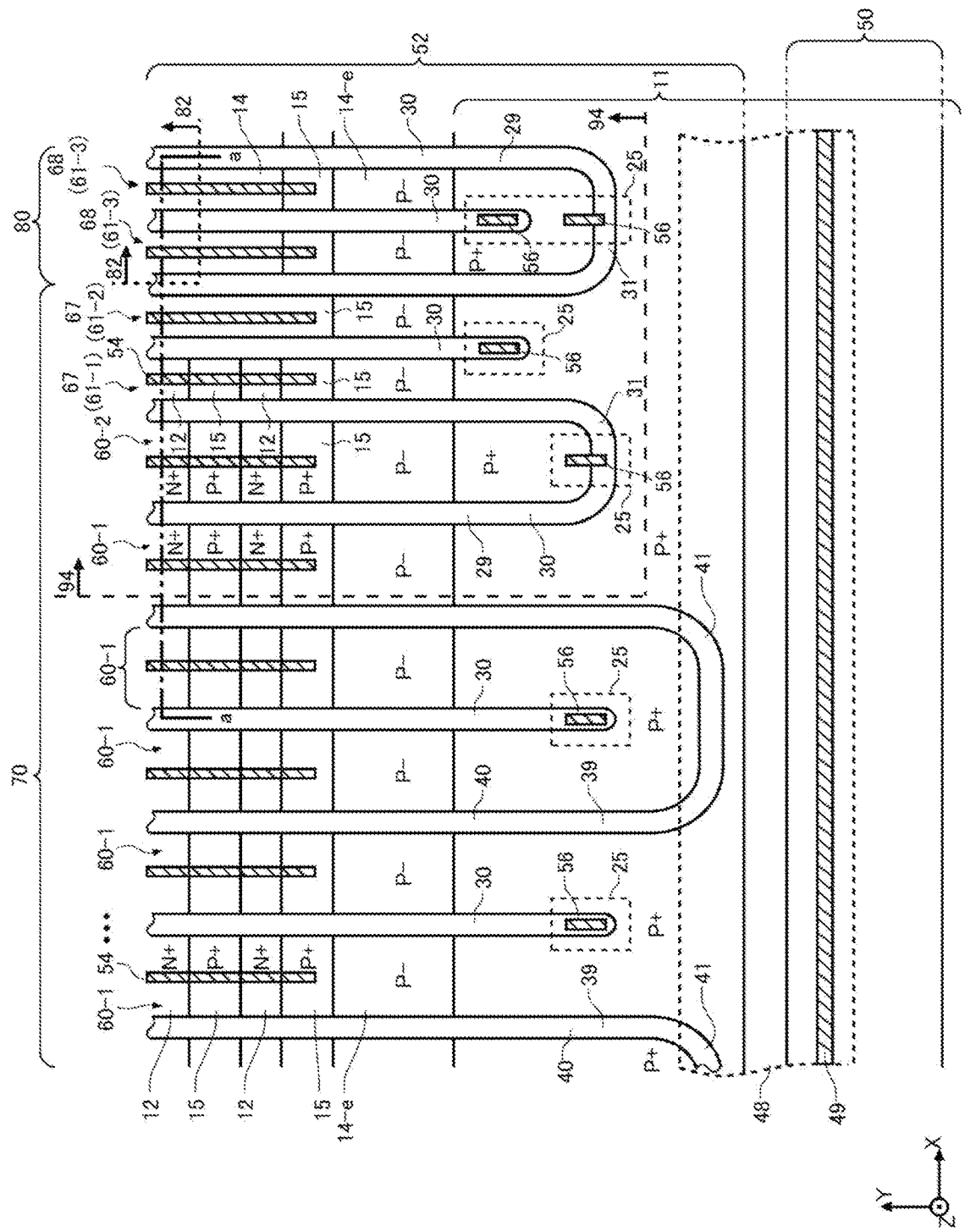
FIG. 10B shows an arrangement example of a lifetime control region 94, as seen from above.

FIG. 10B shows an arrangement example of the lifetime control region 94, as seen from above. The lifetime control region 94 may be arranged closer to the dummy trench part 30 than the gate wiring 48 in the extension direction (Y-axis direction). In another example, the lifetime control region 94 may be arranged beyond the gate wiring 48 in the extension direction. In the example of FIG. 10B, the lifetime control region 94 is arranged closer to the dummy trench part 30 than the gate wiring 48. Thereby, it is possible to prevent the crystal defects or damage due to the ion injection for forming the lifetime control region 94 from being introduced into a gate insulating film between the gate wiring 48 and the semiconductor substrate.

Figure 11:
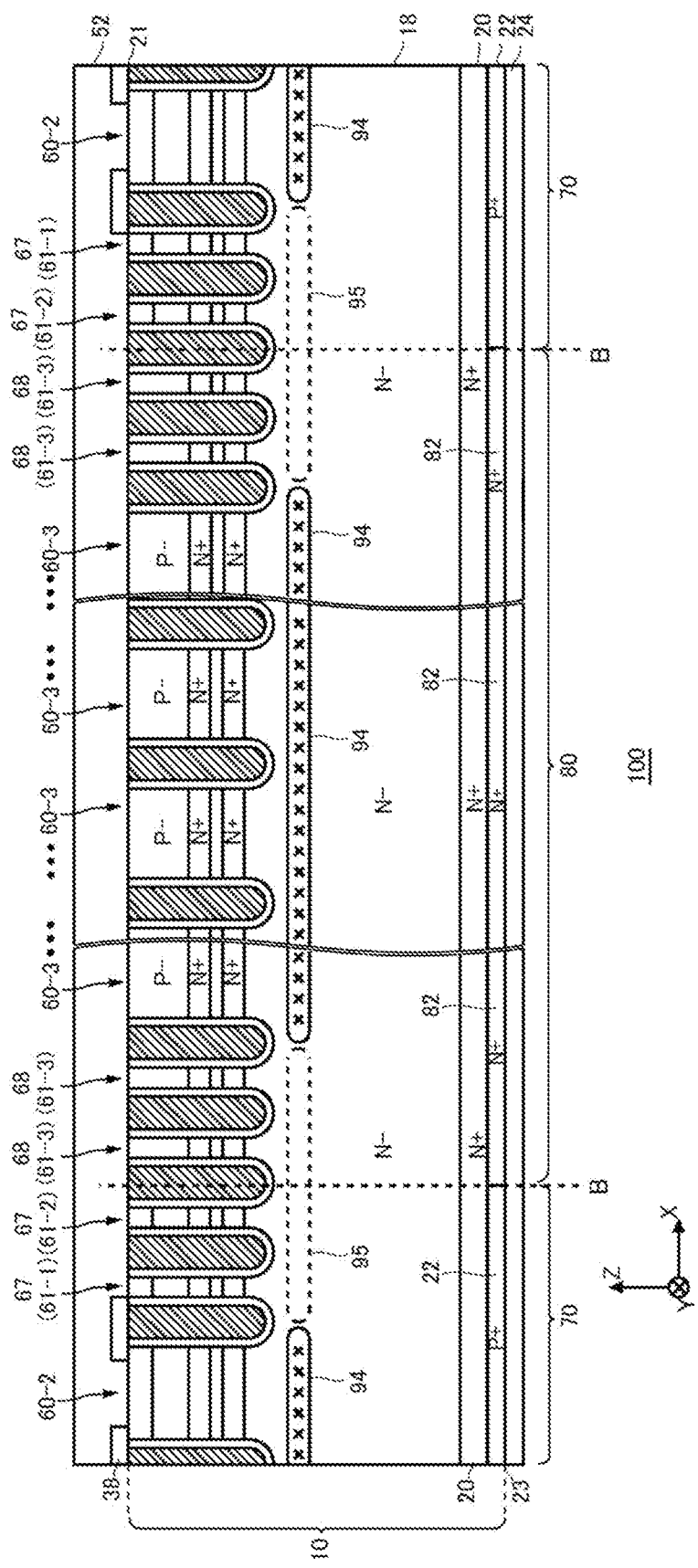
FIG. 11 shows another example of a cross-section of the diode section 80 and a part of the transistor sections 70 arranged on both sides of the diode section 80.

FIG. 11 shows another example of a cross-section of the diode section 80 and a part of the transistor sections 70 arranged on both sides of the diode section 80. The cross-section is an XZ cross-section passing the emitter region 12 and the cathode region 82.

In the present example, each of the diode section 80 and the transistor section 70 has the lifetime control region 94 on the upper surface 21-side of the semiconductor substrate 10. In the semiconductor substrate 10 of the present example, a low-defect region 95 is provided between the lifetime control region 94 in the diode section 80 and the lifetime control region 94 in the transistor section 70 in the arrangement direction (X-axis direction). The low-defect region 95 is a region in which a defect density is lower than the lifetime control region 94.

The defect density in the low-defect region 95 may be the same as a defect density in another region in which the lifetime control region 94 is not provided. Alternatively, the defect density in the low-defect region 95 may be lower than the lifetime control region 94 and higher than the defect density in another region in which the lifetime control region 94 is not provided. In the present example, the defect density in the low-defect region 95 is the same as the defect density in another region in which the lifetime control region 94 is not provided.

For example, the defect density in the low-defect region 95 may be the same as a defect density in a center region of the semiconductor substrate 10 in the depth direction that is immediately below the low-defect region 95. The configuration "the defect density is the same" includes a case where there is an error of about 10%, for example. Also, the defect density in the low-defect region 95 may be higher than the defect density in the center region of the semiconductor substrate 10 in the depth direction and may be lower than the defect density in the lifetime control region 94.

The low-defect region 95 may be provided within in a range including the boundary B between the diode section 80 and the transistor section 70 in the arrangement direction. The low-defect region 95 may also be provided below all the narrow-width mesa parts 61. Since the holes are relatively less injected from the narrow-width mesa part 61, when the lifetime control region 94 is provided, a carrier density may be excessively reduced. However, the low-defect region 95 is provided, so that it is possible to appropriately regulate the carrier density below the narrow-width mesa part 61.

The low-defect region 95 may be provided below the second narrow-width mesa part 61-2 and below one or more third narrow-width mesa parts 61-3. The low-defect region 95 may also be provided below the first narrow-width mesa part 61-1. The low-defect region 95 may be provided for some of the third narrow-width mesa parts 61-3 close to the second narrow-width mesa parts 61-2 among the third narrow-width mesa parts 61-3.

Figure 12:
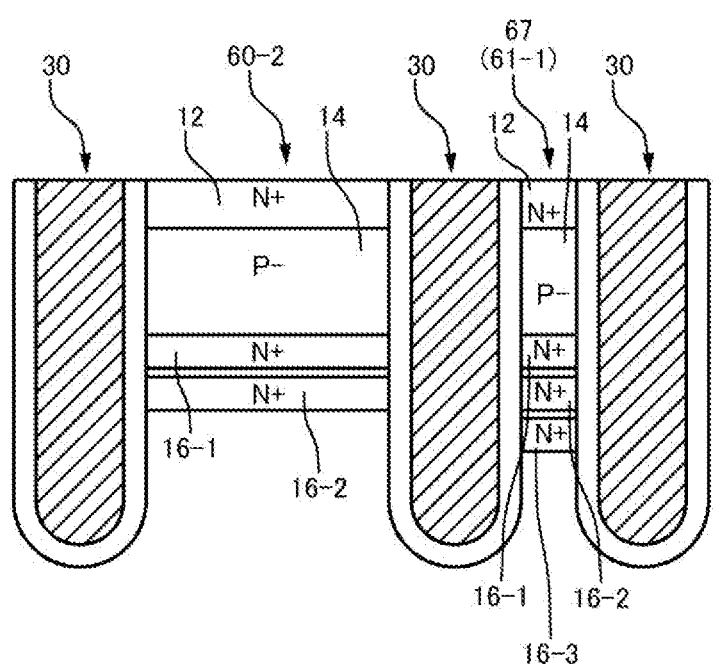
FIG. 12 shows a configuration example of a narrow-width mesa part 61 and an accumulation region 16 in a mesa part 60.

FIG. 12 shows a configuration example of the narrow-width mesa part 61 and the accumulation region 16 in the mesa part 60. A value of integral of the doping concentrations of the accumulation regions 16 of in at least one narrow-width mesa part 61 in along the depth direction is greater than a value of integral of the doping concentrations of the accumulation regions 16 in the mesa part 60. In the example of FIG. 12, the number of stages of the accumulation region 16 in the narrow-width mesa part 61 in the depth direction is larger than the number of stages of the accumulation region 16 in the mesa part 60 in the depth direction. A peak value of the doping concentrations of the accumulation regions 16 of in the narrow-width mesa part 61 in may be greater than a peak value of the doping concentrations of the accumulation regions 16 in the mesa part 60.

In the example of FIG. 12, an example is shown in which an integrated concentration of the accumulation region 16 in the first narrow-width mesa part 61-1 is higher. However, an integrated concentration of the accumulation region 16 in the second narrow-width mesa part 61-2 may also be higher than an integrated concentration of the accumulation region 16 in the mesa part 60. An integrated concentration of the accumulation region 16 in the third narrow-width mesa part 61-3 may also be higher than the integrated concentration of the accumulation region 16 in the mesa part 60. By the above configuration, it is possible to further reduce the injection of the holes from the narrow-width mesa part 61.

In another example, an integrated concentration of the accumulation region 16 in the narrow-width mesa part 61 may be set lower than the integrated concentration of the accumulation region 16 in the mesa part 60. Thereby, an injection amount of the holes from the narrow-width mesa part 61 may be appropriately regulated.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 25 . . . connection portion, 27 . . . plug region, 29 . . . extension portion, 30 . . . dummy trench part, 31 . . . edge portion, 32 . . . dummy insulating film, 34 . . . dummy conductive portion, 38 . . . interlayer dielectric film, 39 . . . extension portion, 40 . . . gate trench part, 41 . . . edge portion, 42 . . . gate insulating film, 44 . . . gate conductive portion, 48 . . . gate wiring, 49 . . . contact hole, 50 . . . gate metal layer, 52 . . . emitter electrode, 54 . . . contact hole, 55 . . . contact hole, 56 . . . contact hole, 60 . . . mesa part, 61 . . . narrow-width mesa part, 67 . . . T-side mesa part, 68 . . . D-side mesa part, 70 . . . transistor section, 80 . . . diode section, 82 . . . cathode region, 92 . . . crystal defect, 94 . . . lifetime control region, 95 . . . low-defect region, 100 . . . semiconductor device

What is claimed is:

1. A semiconductor device comprising:
a semiconductor substrate having a first conductivity-type drift region;
a transistor section having a second conductivity-type collector region exposed on a lower surface of the semiconductor substrate; and
a diode section having a first conductivity-type cathode region exposed on the lower surface of the semiconductor substrate, and provided alongside of the transistor section in an arrangement direction as seen from above, wherein
each of the transistor section and the diode section includes:
a plurality of trench parts each ranging from an upper surface of the semiconductor substrate to the drift region and arranged in the arrangement direction;
an insulating portion formed on an inner wall of each of the trench parts;
a conductive portion provided in each of the trench parts and insulated from the inner wall of each of the trench parts by the insulating portion;
a plurality of mesa parts each arranged between adjacent two of the trench parts in the arrangement direction and each having a predetermined mesa width in the arrangement direction;
an interlayer dielectric film provided to cover a part of the trench parts on the upper surface of the semiconductor substrate and having contact holes for exposing upper surfaces of one or more of the mesa parts; and a first electrode in contact with the mesa parts via the contact holes,
the mesa parts in the transistor section include two or more T-side mesa parts arranged the closest to the diode section,
the mesa parts in the diode section include one or more D-side mesa parts arranged the closest to the transistor section, and
a mesa width of mesa parts electrically connected to the first electrode in the transistor section excluding the T-side mesa parts is greater than both a mesa width of each of the T-side mesa parts and a mesa width of each of the D-side mesa parts.

2. The semiconductor device according to claim 1, wherein
at least some of the T-side mesa parts each have a first conductivity-type T-side emitter region in contact with the first electrode via the contact holes.

3. The semiconductor device according to claim 1, wherein
the T-side mesa parts and the D-side mesa parts respectively include a T-side mesa part and a D-side mesa part that are arranged at a boundary between the transistor section and the diode section, and at least one of the T-side mesa part and the D-side mesa part has the mesa width which is the smallest in the mesa parts in the transistor section and the mesa parts in the diode section.

4. The semiconductor device according to claim 1, wherein
the mesa width of each of the T-side mesa parts and the D-side mesa parts is smaller than the mesa width of a mesa part of the mesa parts that is arranged at a center of the transistor section in the arrangement direction.

5. The semiconductor device according to claim 1, wherein
the transistor section includes gate trench parts and dummy trench parts as the trench parts,
the diode section includes dummy trench parts as the trench parts, and
each of the T-side mesa parts is arranged between adjacent two of the dummy trench parts and each of the D-side mesa parts is arranged between adjacent two of the dummy trench parts.

6. The semiconductor device according to claim 5, wherein
the trench parts include trench parts that are in contact with at least one of the T-side mesa parts and the D-side mesa parts, and at least one of the trench parts in contact with at least one of the T-side mesa parts and the D-side mesa parts is not covered with the interlayer dielectric film, and the conductive portion thereof is in contact with the first electrode.

7. The semiconductor device according to claim 6, wherein
the trench parts include trench parts arranged between two of the T-side mesa parts, arranged between two of the D-side mesa parts, and arranged between the T-side mesa parts and the D-side mesa parts, which are not covered with the interlayer dielectric film, and the conductive portions thereof are in contact with the first electrode.

8. The semiconductor device according to claim 6, wherein
a dummy trench part of the dummy trench parts that is arranged between the T-side mesa parts and a mesa part of the mesa parts that has a greater mesa width than the T-side mesa parts is covered with the interlayer dielectric film.

9. The semiconductor device according to claim 6, wherein
all the trench parts in the diode section are not covered with the interlayer dielectric film, and the conductive portions thereof are in contact with the first electrode.

10. The semiconductor device according to claim 9, wherein
all the mesa parts in the diode section are the D-side mesa parts.

11. The semiconductor device according to claim 9, wherein
at least some of the mesa parts in the transistor section each include:
a first conductivity-type emitter region arranged in contact with the gate trench parts and exposed on the upper surface of the semiconductor substrate;
a second conductivity-type base region provided between the emitter region and the drift region;
a second conductivity-type contact region exposed on the upper surface of the semiconductor substrate and having a higher doping concentration than the base region; and
a plug region exposed on the upper surface of the semiconductor substrate and having a higher doping concentration than the contact region, and
the D-side mesa parts in the diode section are not provided with the plug region.

12. The semiconductor device according to claim 6, wherein
a mesa part of the mesa parts that is arranged at a center of the diode section in the arrangement direction has the mesa width greater than the width of a D-side mesa part of the D-side mesa parts arranged the closest to the transistor section in the diode section.

13. The semiconductor device according to claim 12, wherein
mesa widths of at least some of the D-side mesa parts are smaller than trench widths of the dummy trench parts in the arrangement direction.

14. The semiconductor device according to claim 6, wherein
the transistor section includes a first mesa part having a first conductivity-type emitter region arranged in contact with the gate trench parts and exposed on the upper surface of the semiconductor substrate, and
at least some of the T-side mesa parts in the transistor section are each a carrier extraction mesa part of which an area ratio of a second conductivity-type region exposed on the upper surface of the semiconductor substrate to an area of the mesa part is greater than the area ratio of the first mesa part.

15. The semiconductor device according to claim 14, wherein
a trench part of the trench parts that is in contact with the carrier extraction mesa part is not covered with the interlayer dielectric film.

16. The semiconductor device according to claim 1, wherein
the diode section includes a lifetime control region on the upper surface-side of the semiconductor substrate, and
the lifetime control region is also provided for at least some of the T-side mesa parts in the transistor section.

17. The semiconductor device according to claim 1, wherein
each of the diode section and the transistor section includes a lifetime control region on the upper surface-side of the semiconductor substrate, and
a low-defect region having a smaller defect density than the lifetime control region is provided between the lifetime control region in the diode section and the lifetime control region in the transistor section in the arrangement direction.

18. The semiconductor device according to claim 17, wherein
the low-defect region is provided in a range including a boundary between the diode section and the transistor section.

19. The semiconductor device according to claim 1, wherein
at least some of the mesa parts in the transistor section each include:
a first conductivity-type emitter region exposed on the upper surface of the semiconductor substrate;
a second conductivity-type base region provided between the emitter region and the drift region; and
an accumulation region provided between the base region and the drift region and having a higher doping concentration than the drift region; and
a value of integral of the doping concentration of the accumulation region in the T-side mesa parts along a depth direction is greater than a value of integral of the doping concentration of the accumulation region in the mesa parts other than the T-side mesa parts along the depth direction.

* * * * *